(12) United States Patent
Funk et al.

(10) Patent No.: US 7,123,980 B2
(45) Date of Patent: Oct. 17, 2006

(54) METHOD AND APPARATUS FOR THE MONITORING AND CONTROL OF A SEMICONDUCTOR MANUFACTURING PROCESS

(75) Inventors: Merritt Funk, Austin, TX (US); Raymond Peterson, Manor, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/087,071

(22) Filed: Mar. 23, 2005

(65) Prior Publication Data

US 2005/0187649 A1    Aug. 25, 2005

Related U.S. Application Data

(63) Continuation of application No. PCT/US03/29980, filed on Sep. 25, 2003.

(60) Provisional application No. 60/414,425, filed on Sep. 30, 2002.

(51) Int. Cl.
*G06F 19/00* (2006.01)
(52) U.S. Cl. .................... 700/121; 710/96
(58) Field of Classification Search ............. 700/121, 700/96, 32, 95, 117
See application file for complete search history.

(56) References Cited

U.S. PATENT DOCUMENTS

| | | | |
|---|---|---|---|
| 5,864,773 A * | 1/1999 | Barna et al. ................. 702/85 |
| 6,263,255 B1 | 7/2001 | Tan et al. |
| 6,480,854 B1 * | 11/2002 | Gross et al. ................. 707/10 |
| 6,571,285 B1 * | 5/2003 | Groath et al. ................ 709/223 |
| 6,630,362 B1 * | 10/2003 | Lensing ....................... 438/14 |
| 6,819,963 B1 * | 11/2004 | Riley et al. .................. 700/29 |
| 6,842,660 B1 * | 1/2005 | Tripathi et al. .............. 700/121 |
| 2002/0087229 A1 | 7/2002 | Pasadyn et al. |
| 2003/0061537 A1 * | 3/2003 | Cha et al. ..................... 714/16 |
| 2003/0169330 A1 * | 9/2003 | Ben-Shachar et al. ... 348/14.09 |
| 2003/0208294 A1 * | 11/2003 | Cheng et al. ................. 700/96 |
| 2004/0135590 A1 * | 7/2004 | Quon .......................... 324/713 |

FOREIGN PATENT DOCUMENTS

| | | |
|---|---|---|
| WO | WO 02/10873 A2 | 2/2002 |
| WO | WO 02/066923 A2 | 8/2002 |

OTHER PUBLICATIONS

"Human Interface Standard for Semiconductor Equipment," SEMI Draft Doc. #2783B, SEMI (Semiconductor Equipment and Materials International) (San Jose, CA), 15 pp., ( 1999).
"Specification for Human Interface for Semiconductor Manufacturing Equipment," SEMI E95-1101, SEMI (Semiconductor Equipment and Materials International (San Jose, CA), 15 pp, (2000, 2001).
"Strategic Cell Controller (SCC) User-Interface Style Guide 1.0," Technology Transfer 92061179A-ENG, SEMATECH, Inc. (Austin, TX), 204 pp, ( Aug. 21, 1992).
"ETCH Systems Advanced Process Control: Installation/Startup Manual, Revision 1.0.2," Tokyo Electron America, Inc. (Austin, TX), 161 pp., ( Jul. 9, 2002).

* cited by examiner

*Primary Examiner*—Jayprakash N. Gandhi
(74) *Attorney, Agent, or Firm*—Pillsbury Winthrop Shaw Pittman LLP

(57) ABSTRACT

An Advanced Process Control (APC) system including Graphical User Interfaces (GUIs) is presented for monitoring and controlling a semiconductor manufacturing process that is performed by a semiconductor processing system. The semiconductor processing system includes a number of processing tools, a number of processing modules (chambers), and a number of sensors, and the APC system comprises an APC server, database, interface server, client workstation, and GUI component. The GUI is web-based and is viewable by a user using a web browser.

33 Claims, 12 Drawing Sheets

METHOD AND APPARATUS FOR THE MONITORING AND CONTROL OF A SEMICONDUCTOR MANUFACTURING PROCESS

CROSS-REFERENCE TO RELATED APPLICATIONS

This is a Continuation Application of International Application No. PCT/US03/29980, filed Sep. 25, 2003, which relies for priority upon U.S. Provisional Application No. 60/414,425, filed Sep. 30, 2002, the contents of both of which are incorporated herein by reference in their entireties.

The present application is related to co-pending applications U.S. Continuation of PCT Application No. 10/951,161, filed on Sep. 28, 2004, which relies for priority upon U.S. Provisional Application No. 60/368,162, filed on Mar. 29, 2002; U.S. Continuation of PCT Application No. 10/966, 112, filed Oct. 18, 2004, which relies for priority upon U.S. Provisional Application No. 60/374,486, filed on Apr. 23, 2002; U.S. Continuation of PCT Application No. 10/987, 194, filed Nov. 15, 2004, which relies for priority upon U.S. Provisional Application No. 60/383,619, filed on May 29, 2002; U.S. Continuation of PCT Application No. 11/025, 227, filed Dec. 30, 2004, which relies for priority upon U.S. Provisional Application No. 60/393,091, filed on Jul. 3, 2002; and U.S. Continuation of PCT Application No. 11/025,396, filed Dec. 30, 2004, which relies for priority upon U.S. Provisional Application No. 60/393,104, filed on Jul. 3, 2002. Each of these applications is herein incorporated by reference in its entirety.

FIELD OF THE INVENTION

The present invention is related to semiconductor processing systems, particularly to semiconductor processing systems, which use Advanced Process Control (APC).

BACKGROUND OF THE INVENTION

Computers are generally used to control, monitor, and initialize manufacturing processes. A computer is ideal for these operations given the complexities in a semiconductor manufacturing plant from the reentrant wafer flows, critical processing steps, and maintainability of the processes. Various input/output (I/O) devices are used to control and monitor process flows, wafer states, and maintenance schedules. A variety of tools exist in a semiconductor manufacturing plant to complete these complicated steps from critical operations such as etching, to batch processing, and inspections. Most tool installations are accomplished using a display screen that is part of the graphical user interface (GUI) of a control computer containing the installation software. Installation of a semiconductor-processing tool is a time consuming procedure.

Semiconductor processing facilities require constant monitoring. Processing conditions change over time with the slightest changes in critical process parameters creating undesirable results. Small changes can easily occur in the composition or pressure of an etch gas, process chamber, or wafer temperature. In many cases, changes of process data reflecting deterioration of processing characteristics cannot be detected by simply referring to the process data displayed. It is difficult to detect early stage abnormalities and characteristic deterioration of a process. Oftentimes prediction and pattern recognition offered by advanced process control (APC) is necessary.

Facility control is often performed by a number of different control systems having a variety of controllers. Some of the control systems may have man-machine interfaces such as touch screens, while others may only collect and display one variable such as temperature. The monitoring system must be able to collect data tabulated for the process control system. The data collection of the monitoring system must handle univariate and multivariate data, the analysis and display of the data, and have the ability to select the process variables to collect. Various conditions in a process are monitored by different sensors provided in each of the process chambers, and data of the monitored conditions is transferred and accumulated in a control computer. If the process data is displayed and detected automatically, the optimum process conditions of a mass-production line can be set and controlled through statistical process control (SPC) charts. Inefficient monitoring of a facility can result in facility downtimes that add to the overall operational cost.

SUMMARY OF THE INVENTION

Accordingly, it is an object of the present invention to provide an Advanced Process Control (APC) system for controlling a processing tool in a semiconductor processing environment, where the APC system comprises an APC server providing a plurality of APC related applications; an Interface Server (IS) coupled to the APC server; a database coupled to the IS and APC server; and a GUI component coupled to the APC server, wherein the IS comprises means for coupling to a processing tool, and means for coupling to a plurality of process modules coupled to the processing tool.

In addition, it is an object of the present invention to provide a method for using an Advanced Process Control (APC) system for controlling a processing tool in a semiconductor processing environment, the method comprising: providing an APC server providing a plurality of APC related applications; providing an Interface Server (IS) coupled to the APC server; providing a database coupled to the IS and APC server; and providing a GUI component coupled to the APC server, wherein the IS comprises means for coupling to a processing tool, and means for coupling to a plurality of process modules coupled to the processing tool.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention. A more complete appreciation of the invention and many of the attendant advantages thereof will become readily apparent with reference to the following detailed description, particularly when considered in conjunction with the accompanying drawings, in which.

DETAILED DESCRIPTION OF AN EMBODIMENT

Figure 1:
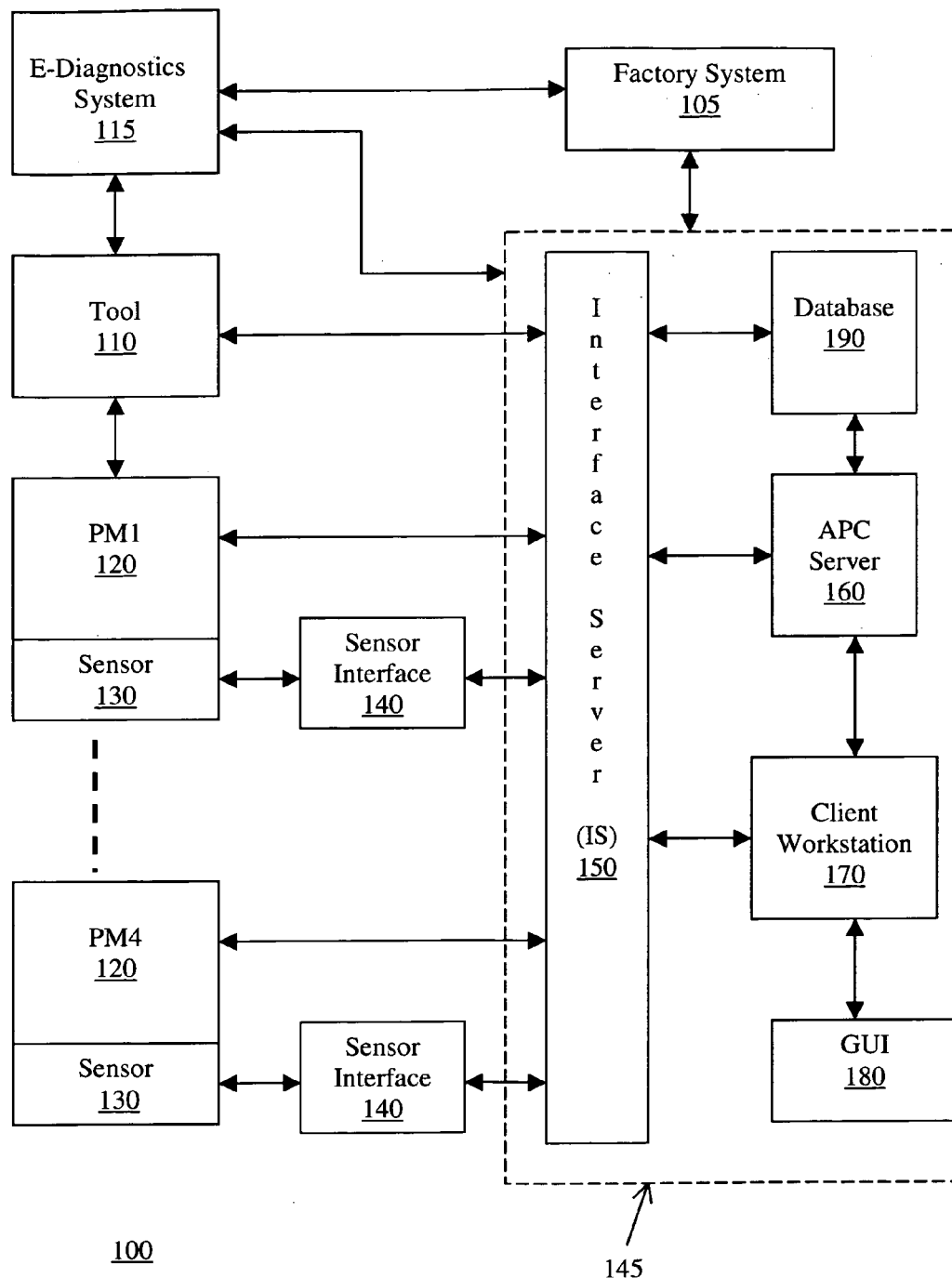
FIG. 1 shows an exemplary block diagram of an advanced process controlled (APC) system in a semiconductor manufacturing environment in accordance with one embodiment of the present invention.

FIG. 1 shows an exemplary block diagram of an APC system in a semiconductor manufacturing environment in accordance with one embodiment of the present invention. In the illustrated embodiment, semiconductor manufacturing environment 100 comprises at least one semiconductor processing tool 110, multiple process modules 120, PM1 through PM4, multiple sensors 130 for monitoring the tool, the modules, and processes, sensor interface 140, and APC system 145. APC system 145 can comprise interface server (IS) 150, APC server 160, client workstation 170, GUI component 180, and database 190. In one embodiment, IS 150 can comprise a real-time memory database that can be viewed as a "Hub".

APC system 145 can comprise a tool level (TL) controller (not shown) for controlling at least one of a processing tool, a process module, and a sensor.

In the illustrated embodiment, a single tool 110 is shown along with four process modules 120, but this is not required for the invention. The APC system 145 can interface with a number of processing tools including cluster tools having one or more process modules, and the APC system 145 can be used to configure and monitor a number of processing tools including cluster tools having one or more process modules. For example, the tools and their associated process modules can be used to perform etching, feature trimming, deposition, diffusion, cleaning, measurement, polishing, developing, transfer, storage, loading, unloading, aligning, temperature control, lithography, integrated metrology (IM), optical data profiling (ODP), particle detection, arc suppression, and other semiconductor manufacturing processes.

An IM element can be arranged as a module (integrated metrology module; IMM) coupled to the processing tool. For example, IMM can be an ODP system (from Timbre Inc.) that measures and analyzes the shape of the features of the wafer.

In one embodiment, processing tool 110 can comprise a tool agent (not shown), which can be a software process that runs on a tool 110 and which can provide event information, context information, and start-stop timing commands used to synchronize data acquisition with the tool process. Also, APC system 145 can comprise an agent client (not shown) that can be a software process that can be used to provide a connection to the tool agent. For example, APC system 145 can be connected to processing tool 110 via an Internet or intranet connection.

For example, an agent client can be used to receive events and their associated messages from a tool agent and propagate those messages on through the APC system. The client software can comprise a communications class, and a driver. The agent client communications class can be designed as a reusable class that is implemented as a dynamically loadable module (DLL). There can also be a message class that is used to parse messages from the tool agent and break those messages out into elements. An agent message class can instantiated with a string received from the tool agent as a parameter. At the time of instantiation, the string is parsed and all class attributes are filled with the data from that string. The agent client communication class communicates with the tool agent via Berkeley sockets application programming interface (BSD sockets), and it can comprise the following methods:

a. Start Agent: A method that establishes communications with the tool agent and sends the agent the start message. When the start acknowledged message is received from the agent, the connection is closed and the event receive thread is spawned. When the initial connection is established with the agent, the local interface that found the tool is stored.

b. Event Receive Thread: This establishes the "event listen" connection with the agent. Once the connection is established, the thread waits indefinitely for a message from the agent. When a message is received, a new agent message object is instantiated and is placed in the message queue. The thread then goes back into the "Waiting for message" state.

c. Get Next Message: A method that gets the next object off of the message queue and passes it back to the caller.

d. Stop Agent: A method that sends a stop signal to the tool agent. When it receives the stop signal, the tool can close its connection with the event receive thread. When the event receive thread senses the connection is closed, it is eliminated.

In one embodiment, processing tool 110 communicates with the IS 150 using sockets. For example, the interface can be implemented using TCP/IP socket communication. Before every communication, a socket is established. Then a message is sent as a string. After the message is sent, the socket is cancelled.

Alternately, an interface can be structured as a TCL process extended with C/C++ code, or a C/C++ process that uses a special class, such as a Distributed Message Hub (DMH) client class. In this case, the logic, which collects the process/tool events through the socket connection, can be revised to insert the events and their context data into a table in IS 150.

The tool agent can send messages to provide event and context information to APC, system. For example, the tool agent can send lot start/stop messages, batch start/stop messages, wafer start/stop messages, recipe start/stop messages, and process start/stop messages. In addition, the tool agent can be used to send and/or receive set point data and to send and/or receive maintenance counter data.

In one embodiment, a common tool agent can be installed on a plurality of processing tools. A common tool agent can allow the interface message format to be common. For example, a communication message format can comprise three parts: a message length, which is the length of message from message ID to terminator; a message ID, which is used for command and event identification; a message body, which contains the contents of the command or event. In addition, the message can use ASCII code, and the length can be changeable. Also, each message can be separated by a control code, and a terminator can be used. In an alternate embodiment, a dual agent can be established on the tool.

When a processing tool comprises internal sensors, the processing tool can be considered a sensor, and this data can be sent to the APC system 145. Data files can be used to transfer this data. For example, some processing tools can create trace files that are compressed in the tool when they are created. Compressed and/or uncompressed files can be transferred. When trace files are created in the processing tool, the trace data may or may not include end point detection (EPD) data. The trace data provides important information about the process. The trace data can be updated and transferred after the processing of a wafer is completed. Trace files are transferred to the proper directory for each process. In one embodiment, tool trace data, maintenance data, and EPD data can be obtained from a processing tool 110.

In FIG. 1 four process modules are shown, but this is not required for the invention. The semiconductor processing system can comprise any number of processing tools having any number of process modules associated with them and independent process modules. The APC system 145 (including one or more TL controllers) can be used to configure, control, and monitor any number of processing tools having any number of process modules associated with them and independent process modules. The APC system can collect, provide, process, store, and display data from processes involving processing tools, process modules, and sensors.

Figure 2:
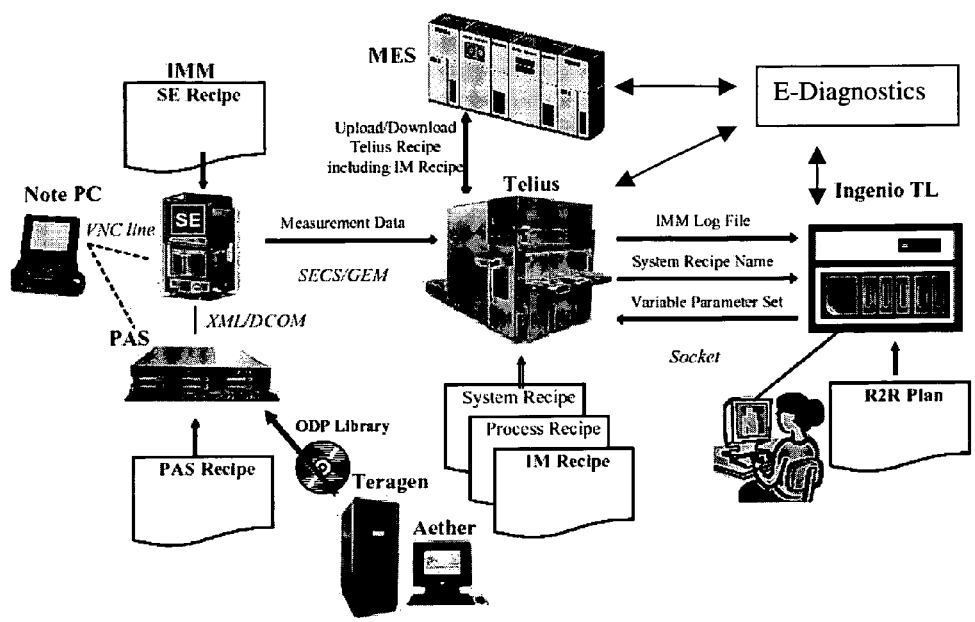
FIG. 2 shows an exemplary block diagram of a system from Tokyo Electron Inc.

Process modules can be identified using data such as ID, module type, gas parameters, and maintenance counters, and this data can be saved into a database. When a new process module is configured, this type of data can be provided using a module configuration panel/screen in GUI component 180. For example, the APC system can support the following tool types from Tokyo Electron Limited: Unity-related process modules, Trias-related process modules, Telius-related process modules, OES-related modules, and ODP-related modules. FIG. 2 shows an exemplary block diagram of a system from Tokyo Electron Inc. Alternately, the APC system can support other tools and their related process modules. For example, APC system 145 can be connected to process modules 120 via an Internet or intranet connection.

The process module ID can be an integer; the number of gas parameters can depend on the module type, and the maintenance counter information can also depend on the module. For example, a user can assign a new name to a specific maintenance counter, assign it a special scale rate, and assign the tool pause function to this maintenance counter. General counters are provided as a part of maintenance counters, and can be configured by the user.

In the illustrated embodiment, a single sensor 130 is shown along with an associated process module, but this is not required for the invention. Any number of sensors can be coupled to a process module. Sensor 130 can comprise an ODP sensor, an OES sensor, a VIP sensor, an analog sensor, and other types of semiconductor processing sensors including digital probes. The APC data management applications can be used to collect, process, store, display, and output data from a variety of sensors.

In the APC system, sensor data can be provided by both external and internal sources. External sources can be defined using an external data recorder type; a data recorder object can be assigned to each external source; and a state variable representation can be used.

Sensor configuration information combines sensor type and sensor instance parameters. A sensor type is a generic term that corresponds to the function of the sensor. A sensor instance pairs the sensor type to a specific sensor on a specific process module and tool. At least one sensor instance is configured for each physical sensor that is attached to a tool.

For example, an OES sensor can be one type of sensor; a VI probe can be another type of sensor, and an analog sensor can be a different type of sensor. In addition, there can be additional generic types of sensors and additional specific types of sensors. A sensor type includes all of the variables that are needed to set up a particular kind of sensor at run time. These variables can be static (all sensors of this type have the same value), configurable by instance (each instance of the sensor type can have a unique value), or dynamically configurable by a data collection plan (each time the sensor is activated at run time, it can be given a different value).

A "configurable by instance" variable can be the sensor/probe IP address. This address varies by instance (for each process chamber) but does not vary from run to run. A "configurable by data collection plan" variable can be a list of harmonic frequencies. These can be configured differently for each wafer based on the context information. For example, wafer context information can include tool ID, module ID, slot ID, recipe ID, cassette ID, start time and end time. There can be many instances of the same sensor type. A sensor instance corresponds to a specific piece of hardware and connects a sensor type to the tool and/or process module (chamber). In other words, a sensor type is generic and a sensor instance is specific.

As shown is FIG. 1, sensor interface 140 can be used to provide an interface between sensor 130 and the APC system 145. For example, APC system 145 can be connected to sensor interface 140 via an Internet or intranet connection, and sensor interface 140 can be connected to sensor 130 via an Internet or intranet connection. Also, sensor interface 140 can act as a protocol converter, media converter, and data buffer. In addition, sensor interface 140 can provide real-time functions, such as data acquisition, peer-to-peer communications, and I/O scanning. Alternately, sensor interface 140 can be eliminated, and the sensor 130 can be directly coupled to APC system 145.

Sensor 130 can be a static or dynamic sensor. For example, a dynamic VI sensor can have its frequency range, sampling period, scaling, triggering, and offset information established at run-time using parameters provided by a data collection plan. Sensor 130 can be an analog sensor that can be static and/or dynamic. For example, analog sensors can be used to provide data for ESC voltage, matcher parameters, gas parameters, flow rates, pressures, temperatures, RF parameters, and other process related data. Sensor 130 can comprise at least one of a: VIP probe, OES sensor, analog sensor, digital sensor, ODP sensor, and other semiconductor processing sensors.

In one embodiment, a sensor interface can write the data points to a raw data file. For example, IS 150 can send a start command to the sensor interface to initiate data acquisition and can send a stop command to cause the file to be closed. IS 150 can then read and parse the sensor data file, process the data and post the data values into the in-memory data tables. Alternately, the sensor interface could stream the data in real time to the IS 150. A switch could be provided to allow the sensor interface to write the file to disk. The sensor interface can also provide a method to read the file and stream the data points to the IS 150 for off-line processing and analysis.

As shown in FIG. 1, APC system 145 can comprise a database 190. Tool maintenance data can be stored in database 190. In addition, raw data and trace data from the tool can be stored as files in the database 190. The amount of data depends on the data collection plans configured by the user, as well as the frequency with which processes are performed and processing tools are run. For example, data collection plans can be established for determining how and when to collect tool status and process-related data. The data obtained from the processing tools, the processing chambers, the sensors, and the APC system is stored in tables.

In one embodiment, the tables can be implemented in the IS 150 as in-memory tables and in database 190 as persistent storage. The IS 150 can use Structured Query Language (SQL) for column and row creation as well as posting data to the tables. The tables can be duplicated in the persistent tables in database 190 (i.e., DB2 can be used) and can be populated using the same SQL statements.

In the illustrated embodiment, IS 150 can be both an in-memory real-time database and a subscription server. For example, client processes are able to perform database functions using SQL with the familiar programming model of relational data tables. In addition, the IS 150 can provide a data subscription service where the client software receives asynchronous notification whenever data that meets their selection criteria is inserted, updated, or deleted. A subscription uses the full power of an SQL select statement to specify which table columns are of interest and what row selection criteria is used to filter future data change notifications.

Because the IS 150 is both a database and a subscription server, clients can open "synchronized" subscriptions to existing table data when they are initialized. The IS 150 provides data synchronization through a publish/subscribe mechanism, in-memory data tables, and supervisory logic for marshalling events and alarms through the system. The IS 150 provides several messaging TCP/IP based technologies including sockets, UDP, and publish/subscribe.

For example, the IS 150 architecture can use multiple data hubs (i.e., SQL databases) that can provide real-time data management and subscription functions. Application modules and user interfaces use SQL messages to access and update information in the data hub(s). Due to performance limitations associated with posting run time data to the relational database, run time data is posted to in-memory data tables managed by the IS 150. The contents of these tables can be posted to the relational database at the end of wafer processing.

In the illustrated embodiment shown in FIG. 1, a single client workstation 170 is shown but this is not required for the invention. The APC system 145 can support a plurality of client workstations 170. In one embodiment, the client workstation 170 allows a user to configure sensors; to view status inclining tool, chamber, and sensor status; to view process status; to view historical data; to view fault data, and to perform modeling and charting functions.

In the illustrated embodiment shown in FIG. 1, APC system 145 can comprise an APC server 160 that can coupled to IS 150, client workstation 170, GUI component 180, and database 190, but this is not required for the invention. The APC server 160 can comprise a number of applications including at least one tool-related application, at least one module-related application, at least one sensor-related application, at least one IS-related application, at least one database-related application, and at least one GUI-related application. In addition, APC server can comprise a number of process-related applications.

The APC server 160 comprises at least one computer and software that supports multiple process tools; collects and synchronizes data from tools, process modules, sensors, and probes; stores data in a database, enables the user to view existing charts; and/or provides fault detection. For example, APC server 160 can comprise operational software, such as the Ingenio software, from Tokyo Electron. The APC server allows online system configuration, online lot-to-lot fault detection, online wafer-to-wafer fault detection, online database management, and performs multivariate analysis of summary data using models based upon historical data. In addition, the APC allows real-time monitoring of processes and processing tools.

For example, APC server 160 can comprise a minimum of 3 GB available disk space; at least 600 MHz CPU (Dual processors); a minimum 512 Mb RAM (physical memory); a 9 GB SCSI hard drives in a RAID 5 configuration; a minimum disk cache that is twice the RAM size; Windows 2000 server software installed; Microsoft Internet Explorer; TCP/IP Network protocol; and at least two network cards.

The software interface to the tables is provided by a combination of TCL and SQL. For example, a loader process, operating in the background, can provide the posting of data to the database that sends SQL commands from a file to database. The transfer of data from the in-memory tables to the persistent tables can be accomplished by writing SQL to a file and placing the file in the loader directory. After the SQL has been executed, the file can be automatically deleted from the loader directory.

Data collected in the system flows through a set of steps between the real-time sensor collection and the database storage. Data collected from the system is first loaded into a real-time memory SQL database in the IS 150. The SQL database provides a physical location for the data to be processed by different algorithms defined by the user through plans in the data management portion of the APC system and by scripts defined by a control job APC system 145 can comprise at least one storage device that stores files containing raw data from sensors and files containing trace data from the tool. If these files are not managed properly (i.e., deleted regularly), the storage device can run out of disk space, and can stop collecting new data. The APC system 145 can comprise a data management application that allow the user to delete older files, thereby freeing disk space so that data collection can continue without interruption. The APC system 145 can comprise a plurality of tables that are used to operate the system, and these tables can be stored in database 190. In addition, other computers (not shown), such as on-site or off-site computers/workstations and/or hosts, can be networked to provide functions such as data/chart viewing, SPC charting, EPD analysis, tale; access, for one or many tools.

As shown in FIG. 1, the APC system 145 can comprise a GUI component 180. For example, a GUI component can run as an application on the APC server 160, client workstation 170, and tool 110.

GUI component 180 enables an APC system user to perform the desired configuration, data collection, monitoring, modeling, and troubleshooting tasks with as little input as possible. The GUI design complies with the SEMI Human Interface Standard for Semiconductor Manufacturing Equipment (SEMI Draft Doc. #2783B) and with the SEMATECH Strategic Cell Controller (SCC) User-interface Style Guide 1.0 (Technology Transfer 92061179A-ENG).

Those skilled in the art will recognize that GUI panels/ screens can comprise a left-to-right selection tab structure and/or a right-to-left structure, a bottom-to-top structure, a top-to-bottom structure, or a combination structure.

In addition, although the screens shown for illustration were English language versions this is not required for the invention and different languages can be used.

Also, GUI component 180 provides a means of interaction between the APC system and the user. When the GUI begins, a logon screen that validates the user identification and password can be displayed and that provides a first level of security. Desirably, users can be registered using a security application before logging on. A database check of user identification indicates an authorization level, which will streamline the GUI functions available. Selection items for which the user is not authorized can be differently and unavailable. The security system also allows a user to change an existing password. For example, the logon panel/ screen can be opened from a browser tool such as Netscape or Internet Explorer. A user can enter a user ID and password in the logon fields.

Authorized users and administrators can use GUI panels/ screens to modify system configuration and sensor setup parameters. The GUI component 180 can comprise a configuration component for allowing a user to configure processing tools, processing modules, sensors, and the APC system. For example, GUI configuration panels/screens can be provided for at least one of a processing tool, a processing module, a sensor, a sensor instance, a module pause, and an alarm. Configuration data can be stored in an attribute database table and can be setup with the defaults at the installation.

The GUI component 180 can comprise a status component for displaying the current status for processing tools, processing modules, sensors, and the APC system. In addition, the status component can comprise a charting component for presenting system-related and process-related data to a user using one or more different types of charts.

Also, GUI component 180 can comprise a real-time operational component. For example, a GUI component can be coupled to a background task, and shared system logic can provide the common functionality used both by the background task and by the GUI component. Shared logic can be used to guarantee that the returned values to the GUI component are the same as the ones returned to the background task. Furthermore, the GUI component 180 can comprise an APC file management GUI component and a security component. Help panels/screens are also available. For example, help files are provided in PDF (Portable Document Format) and/or HTML format.

As shown in FIG. 1, an APC system 145 can be coupled to a factory system 105 and/or an E-diagnostics system 115. Factory system 105 and/or E-diagnostics system 115 can provide means for externally monitoring and for externally controlling the tools, modules, sensors, and processes in a semiconductor processing system. Alternately, the factory system 105 and/or an E-diagnostics system 115 can perform tool status monitoring. For example, a user can access the tool status monitoring system using a web based terminal that is coupled to the semiconductor processing system via factory system 105 and/or an E-diagnostics system 115.

In addition, the APC system and the E-diagnostics system can work together to solve problems in real time. For example, when the APC system 145 detects a fault, the information needed to diagnose the problem can be bundled by the APC server and transmitted to the E-diagnostics system or stored for access by the E-diagnostics system at a later time. The operating method can be determined using security constrains and/or customer business rules.

Also, the APC comprises means for adding sensors, editing data collection plans that are context and/or event driven. For example, this can allow E-diagnostics "probes" and/or software components to be downloaded for the E-diagnostics system to trouble shoot the system. The APC system can comprise a portable set of diagnostic tools that can provide additional data, which can be used to diagnose, detect, and/or predict a problem. For example, the APC system can use these diagnostic tools as additional sensors. With a general sensor interface that support multiple protocols, including analog input as the lowest level, a local portable diagnostic unit can be coupled to the factory system and then used remotely by the APC system, the E-diagnostics system and/or the factory system.

The APC system can be provided with a new application that was remotely developed at the factory and downloaded from the factory or the E-diagnostics System. For example, the new application can reside locally in the APC server. The APC system has the ability to learn new procedures and dynamically add sensors, add applications, and even add GUI screens for a custom sensor. Furthermore, the APC system can perform very specific procedures such as a timing analysis allocation to figure out when a tool and/or module malfunctions (i.e. a wafer handling system problem with a motor or actuator arm position).

In addition, the APC system can change the sampling rate based on the tool performance. For example, the data collection sampling rates and amount of analysis can be changed based on tool health. The APC system can also predict a problem or detect that a tool and/or module is running near a limit condition.

In addition, advanced users and administrators can use GUI screens modify system configuration and sensor setup parameters; create and edit tool-related strategies and plans; and/or modify the number tools and modules.

The APC system is implemented using a configurable system that enables customers (end users) to add processing tools, process modules, and/or sensors. The APC system provides a development environment and methodology that enables customers to customize the monitoring software, to add analysis applications, and/or to install and monitor new tools, modules, and sensors in the environment.

The APC system software architecture includes four functional components: a data acquisition component, a messaging system component, a relational database component, and a post-processing component. The architecture also includes in-memory data tables used for storing run-time data acquisition parameters. External to the APC system is the tool, as well as a tool agent, which provides context information and start-stop timing commands used to synchronize data acquisition with the tool process.

The data acquisition component collects data points, called parameters and writes them to a file. The messaging system uses in-memory data tables for temporary storage of the run-time data received from the data acquisition component. The messaging system is notified of the start and end of the data acquisition period by an agent and/or tool client. At the end of the data acquisition period, the data is posted to the relational database and the in-memory data tables are cleared for the next acquisition period. Post processing of the data supplied by the messaging system is performed at run-time; post processing of the data stored in the relational database is performed off-line.

The goal of the APC system is to use real-time and historical data to improve the semiconductor processing system's performance. To achieve this goal, potential problems can be predicted and corrected before they occur, thus reducing equipment downtime and the number of non-product wafers that are produced. This can be accomplished by collecting data and then feeding that data into a software algorithm that models the behavior of a particular tool, process module, and/or sensor. The APC system outputs process parametric adaptations that are then either fed forward or back to keep the tool performance within the specified limits. This control can be accomplished in different forms at different levels.

The alarm management portion of the APO system can provide fault detection algorithms, fault classification algorithms, and/or fault forecasting algorithms. The APC system can predict when a tool, process module, and/or sensor might malfunction, and can identify possible solutions to correct the malfunction and to reduce the number of non-product wafers that are produced during maintenance and processing functions.

Fault forecasting is a combination of fault detection and failure modeling. This method can be used to optimize chamber cleaning and the replacement of consumable parts and it is intended to facilitate "opportunistic scheduling" of preventive maintenance tasks when there is a lull in production. Fault forecasting can be based either on a complex multivariate model or a simple univariate relationship (e.g. APO angle for a wet clean in etch). For example, fault forecasting can be used to predict when a tool, process module, and/or sensor might fail, and when to perform maintenance on a tool, process module, and/or sensor.

The GUI applications give the user the ability to determine if a sensor is collecting data. When a data collection plan does not require data from a sensor, the sensor status state provides the user an indication that this sensor is not expected to be on. For example, when a data collection plan does not require data from a sensor the sensor status should be "on-line off", and when the user has disabled a sensor at the system level the state should be "off-line off".

The interface to a tool, module, and/or sensor is tolerant to failures and service related disruptions. Additionally the interface provides setup and trouble shooting capability. For example, when a disruption occurs, the tool, module, and/or sensor and/or APO system can detect the disruption and initiate logging, alarms and automatic recovery/analysis to determine the correct behavior and to minimize the loss of functionality. In this way, the risk to the customer of producing product while a tool, module, sensor, and/or APC system is operating at a decreased functionality can be reduced.

In addition, the trouble-shooting and/or maintenance applications can operate during the service/maintenance mode. For the purpose of trouble shooting sensor communications, a sensor can be tested without running wafers. For example, a sensor can be set up, started and stopped from a WEB based GUI. This feature can be commonly used at sensor setup and routine sensor maintenance.

The APC system can be installed and configured as shown in Doc. No. 1 D97-A50003-21 from Tokyo Electron Limited, INC. This document is entitled "APC Installation/Startup Manual", and is incorporated by reference in its entirety in the present invention.

Figure 3:
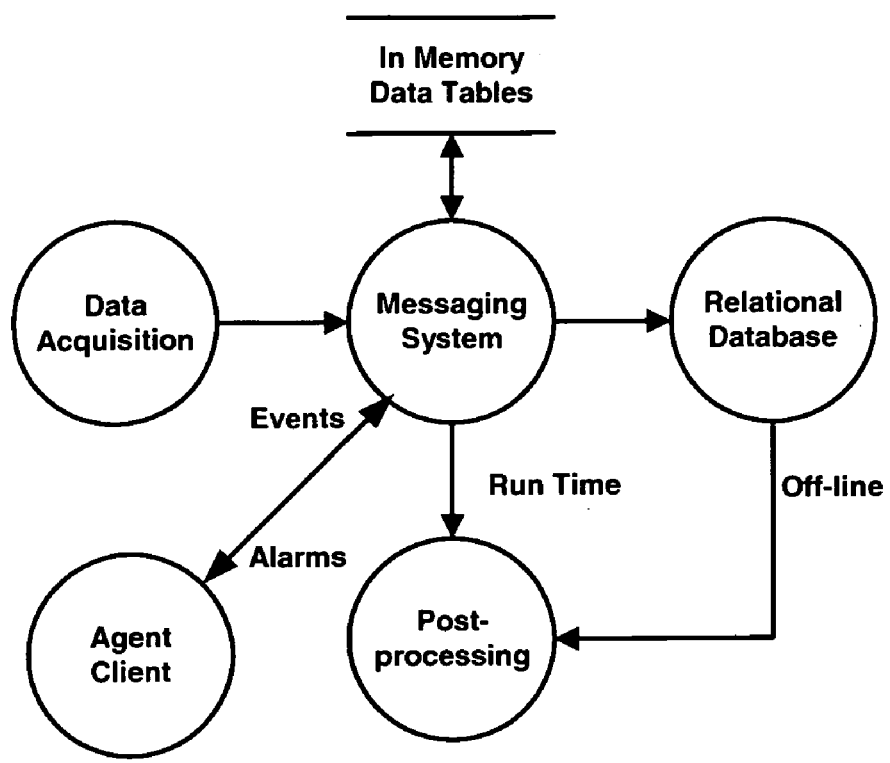
FIG. 3 is a simplified data flow diagram for the APC system in accordance with one embodiment of the present invention.

FIG. 3 is a simplified data flow diagram for the APC system in accordance with one embodiment of the present invention. The primary data flow paths are shown in FIG. 3. The APC software architecture includes four functional subsystems: a data acquisition subsystem, a messaging system subsystem, a relational database subsystem, and a post-processing subsystem. The architecture also includes in-memory data tables used for storing run-time data acquisition parameters. External to the APC software is the tool, as well as the tool agent, which provides context information and start-stop timing commands used to synchronize data acquisition with the tool process.

The data acquisition subsystem collects data points, called parameters and writes them to a file. The messaging system uses in-memory data tables for temporary storage of the run-time data received from the data acquisition subsystem. The agent client notifies the messaging system of the start and end of the data acquisition period. At the end of the data acquisition period, the data is posted to the relational database, and the in-memory data tables are cleared for the next acquisition period. Post processing of the data supplied by the messaging subsystem is performed at run-time; post processing of the data stored in the relational database is performed off-line.

Data acquisition, also known as data collection, is accomplished through two routes. The tool collects data during a wafer run and stores the data in a trace file. After each wafer is processed on the tool, the trace file is copied from the tool to the APC file system, where the APC software parses the file and posts the data to the in-memory data tables. The in-memory data is then sent to the relational database and finally posted to the post-processing component.

Process related data is collected by the APC system, using one or more sensors, each one using a data recorder. At run time, this data is sent to a file similar to the trace file on the tool. At recipe end, the file is parsed and the data is sent to the in-memory data tables, which are managed by the IS 150.

Post-processing data flow follows one of two paths. When the post-processing is done at run-time, the data flows from the IS 150 to at least one post-processing component. When the post-processing is done off-line, the data flows from the relational database to the post-processing component. These two paths are illustrated in FIG. 3 and are labeled "run-time" and "off-line" respectively.

Figure 4:
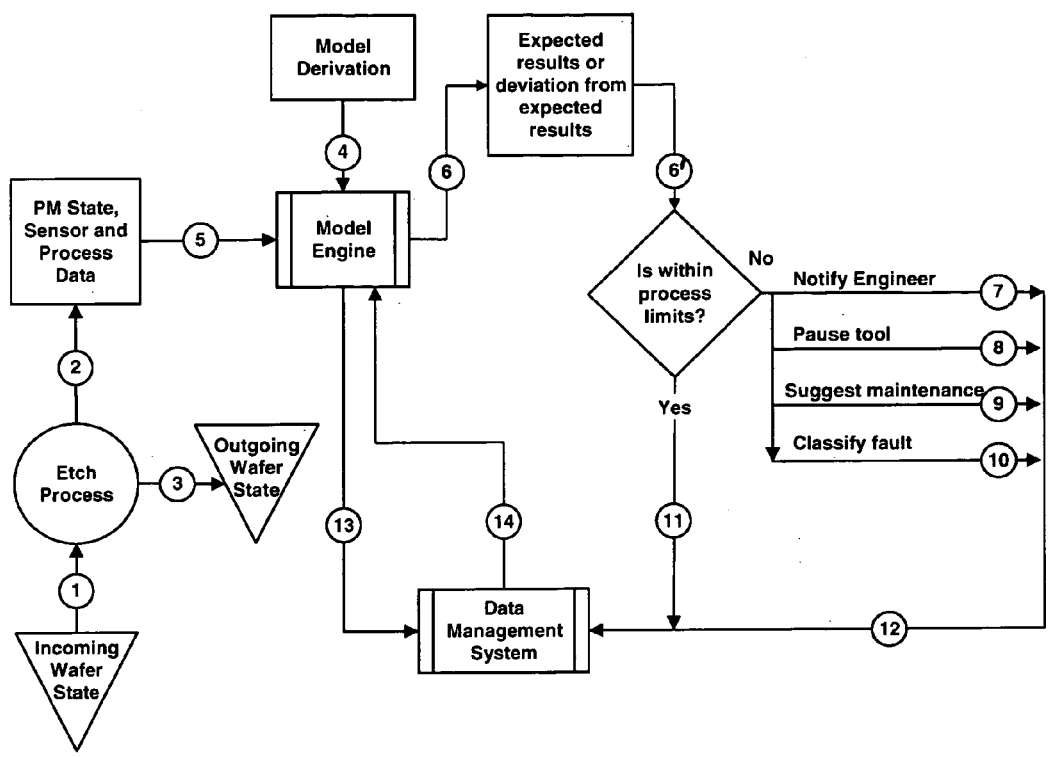
FIG. 4 illustrates a simplified interface diagram in accordance with an embodiment of the present invention.

FIG. 4 illustrates a simplified flow diagram for a Fault Detection and Classification (FDC) process in accordance with an embodiment of the present invention. In the illustrated embodiment, an etch processing module is shown along with various components of the APC architecture.

In FIG. 4 an incoming wafer state and an outgoing wafer state are shown. For example, the incoming wafer state can be characterized by a context comprised of the Wafer ID, Lot ID, Cassette number, Slot ID, process step or layer number, process recipe. Additional information such as the incoming layer thickness may also be available. Also, the outgoing wafer state is characterized by a context comprised of the Wafer ID, Lot ID, Cassette number, Slot ID, process step or layer number, process recipe.

An etch processing module is also shown, but other module can be used. For example, a plasma etch process can be based on a recipe and can comprise one or more steps. Steps can be numbered consecutively and refer to periods of time when the process set points remain constant. Process set points are changed at step boundaries depending on the recipe.

In addition, a model derivation component is shown, For example a model derivation component can comprise the configuration and data needed for the process model engine to perform analysis on the current wafer process. The configuration can be supplied from the user, usually a process engineer and comprises sensor settings, a list of process variables to collect, a list of sensor variables to collect, instructions on how to process each of the variables and a selection of which type of modeling to perform. The data can comprise values extracted from a training set representing a process that is operating normally.

A process module (PM) state, Sensor and Process Data element is also shown in FIG. 4. One function of APC system is to collect data from various sensors and synchronize the data collection with the processing in the Etch tool. The number and type of data to collect depends on configuration parameters, called the data collection plan. The process module (PM) state, the sensor data, and process data can be collected in a table. Data collection is synchronized with the etch process by events coming from the Tool Agent as reported by the Tool Agent Client.

The process model engine, shown in FIG. 4, can provide for the processing and analysis of raw data as well as a various ways to compare the current process with previous wafer processing represented by the training set. A summary of selected variables based on the data analysis plan can be created, and the summarized data can be sent to the model engine. For example, the model engine can support "PCA" and "PLS" models. Typically, if only process variables are known then PCA is used. If process variables and metrology data are available then PLS is used.

A Data Management System element is also shown in FIG. 4. In the APC system, the data and actions taken are posted to the data management system. The data management system is comprised of a persistent database as well as a file system for saving the sensor and process data. The sensor data, process data, and the results from the processing of the sensor and process data are posted to the persistent database and file system depending on the settings in the data collection and data analysis plans.

In FIG. 4, a model output element is shown that is labeled "Expected results or deviation from expected results". For example, the output from the process model engine is the expected results or deviation from expected results in the form of one or more numerical values. In the case of PCA or PLS analysis, the, values represent a collection of process variables summarized as statistical parameters in the database and can be labeled "T2 and Q". Other summaries can be produced by the process model engine according to the configuration in the data analysis plan.

A query element is also shown in FIG. 4 in which the expected results or deviation from expected results are compared using SPC run-rules comprised of upper and lower numerical limits as well as a set of pattern matching rules called the "Western Electric Rules". The term process limits refers to a set of numerical values that have been established for the particular process. These values can compise an upper control limit and a lower control limit. The action taken when the process is not within the limits is based on configuaration in the analyisi strategy.

In 1, the Incoming Wafer state is provided to the Etch Process module. For example, the incoming wafer can be characterized by wafer ID (scribe), Lot ID, layer number or process step, cassette number, slot ID and etch recipe name. This information is passed to etch tool prior to the etch processing and is passed to the APC system along with the "WAFER IN" event. The event and associated data are sent from the tool agent to the tool agent client. Upon receipt of the "WAFER IN" event the APC server, posts the associated data to the in-memory tables, performs a look-up, based on the recipe name, of the sensor configuration required by the data collection plan and sends the configuration to each sensor. At a later time, the etch process sends a "RECIPE START" event from the tool agent to the tool agent client signaling the start of the etch process. The APC server responds by sending a "Start acquisition" command to each of the sensors. In addition, other events are possible during etch wafer processing.

In 2, the Etch Process module provides data such as PM State, Sensor data, and Process data. For example, upon completion of the etch process, the etcher module can write the etch process data files to a local disk drive on the etcher and can send a "RECIPE END" event from the tool agent to the tool agent client. Upon receipt of the "RECIPE END" event, the APC server transfers the data files from the tool to the APC server file system. Upon completion of the file transfer, the APC server parses each of the process files and sensor data and posts the results to the in-memory tables.

In 3, the Etch Process data can be used to establish an Outgoing Wafer State. For example, the end of processing and removal of the wafer from the etch process can be signaled by the "WAFER OUT" event sent from the tool agent to the tool agent client. The APC server can respond by posting the event and associated data to the in-memory tables and initiating any processing routines that are associated with the wafer object.

In 4, the Model Derivation output is provided to the Model Engine. For example, the completion of the summary calculations can trigger the execution of the process model. At this point, the model derivation, consisting of a set of instructions and input data from a previously analyzed training set, is read into the process model engine. The model derivation may include instructions on how to output the results as a deviation from the expected results.

In 5, the PM State, Sensor data, and Process data can be provided to the model Engine. For example, once the process and sensor data have been posted to the in-memory tables, the processing of the data can begin. Processing proceeds by producing summary calculations, producing statistical summaries of individual process steps within the etch process recipe. The selection of the parameters and type of statistical calculation to perform is configurable by the user. Average, standard deviation, the minimum and maximum can be calculated for each parameter and process step. The results of these calculations can be posted in an in-memory table for further processing. Completion of the processing of summary calculations can trigger the execution of the process model provided metrology results are not required.

In 6, the Model Engine outputs its results. For example, the execution of the process model engine produces one or more numerical results in the form of expected or deviation from expected results depending on the instructions in the model derivation. Each of these results can be sent to a run rule evaluation process for evaluation against a set of configurable runs. These rulers include evaluation of the current point against a set of values that indicate whether or not the process in within limits.

In 7–10, processes are shown for situations when the process is not within the limits. For example, when a fault is detected the system can be configured to notify an engineer. This can be implemented though the alarm system to either send e-mail or page the appropriate person or persons.

When a fault is detected the system can be configured to Pause the tool. This can be implemented by sending a value to a specific tool maintenance counter. When a fault is detected the system can be configured to suggest maintenance. This can be implemented, though the alarm system, to either send e-mail or page the appropriate person or persons. When a fault is detected the system can be configured to classify the fault. This can be a manual operation involving the drill down from the SPC chart that indicates the alarm to the contribution chart (if the process model uses PCA or PLS) to the trace chart.

In 11 and 12, data is sent to the data management system. For example, if no fault is detected, this event can be posted to the data management system. Also, when a fault is detected or correction is required, the fault action(s) can be posted to the persistent database.

In 13 and 14, data is exchanged between the model engine and the data management system. For example, after the data for a process has been processed and analyzed by the process model engine, it can be posted to the persistent database. In addition, certain scenarios require the historical data from previous process runs be reconstructed in the process model engine for comparison with the current state of the process. Also, the process model engine can predict a CD based on process and sensor data. Over time, such models are known to drift from the actual process performance. Periodic comparison with actual metrology results allows the process model to be corrected for this drift.

The APC system 145 (FIG. 1) can comprise a plurality of tables that are used to operate the system, and these tables can be stored in database 190 (FIG. 1).

The tables can include a component table that can be used to configure components of the system, such as input sensor devices, process tools, analysis modules, output interfaces, equipment resources, etc. For example, a component table can include items such as assignment of unique module/component ID, description of the module/component, etc.

Also, the tables can include an attribute table, and each component in the components table can have multiple associated records in the attribute table, which can be used to specify such things as the device location, clock offsets, time of last calibration, owner engineer, etc. For example, the attribute table can contain setup information for the tool, chamber, etc. System configuration parameters can be stored in the attribute table with type='system' and ID='configuration'. The remaining columns in the table, name, and value" are used to identify specific parameters and their values.

In addition, APC system configuration GUI screen can obtain data from the attribute table. For example, when a user performs a save or a delete operation data in the attribute table can be updated.

The APC system can also comprise a run attributes table that can be used to manage normalized storage of (name, value) pairs for components, process runs, model data tables, and other entities. With this separate table, there is no limit on the number of pairs, and specific items can be found quickly because of the normalized, indexed representation. Some tables have a non-normalized attributes field; this is done in cases where the expected number of attributes is small and the usage pattern does not demand better direct access to individual values.

An associations table can also be included in the APC system. It can be a generic table used to indicate associations. For example, the association of a model with a table of model input data can have parent type='model', parent ID='my model1', item type='table', item ID='model data1', and attributes='{last edit {1999-05-19 09:30:23}}'

In addition, the APC system can comprise a process run table that can be used to define header tables for raw runs. A process run table can contain items such as start time, wafer, material type, etc. A context row can be created before any associated raw rows so that the software knows the context. Other associated attributes of the run are recorded in the attributes table and joined using a parameter such as a run ID.

Furthermore, the APC system can comprise a device run table that can contain setup and operating parameters for the sensor device for the run. For example, the device run table can also comprise header data to indicate what observations are written to the raw run data. This allows the setup and data collected to be changed from run to run.

In addition, the APC system can comprise a raw run data table that can be used to collect and publish raw observations. For example, each wafer can have a raw run data table associated with it.

A model map table can also be used to configure the mapping of raw sensor readings to model data tables. For example, an output table can be configured to have complete rows without missing values, and there are configuration options, such as interpolating data, or using previous observations, that can be used during the output creation. The table can also have attributes in the attributes table indicating who set up the map, when it was last revised, etc.

Also, the APC system can comprise a model columns table that can be used to describe the columns in the model data tables. For example, the data can be used to dynamically create new model data tables. The model data table can be a dynamically created table to hold input and output data for model analysis. The creation and population of the tables can be configured in the raw to model data map table.

The APC system can also comprise a run summary table that can contain run summary information. For example, a run summary table can contain information such as a run ID, a run type, a value name, a start step, an end step, a value min, and a value max.

The APC system can also comprise at least one alarm table that can contain alarm information (e.g., time stamp, alarm code, description, etc.).

A multivariate analysis model table can also be provided. For example, this table and related tables can be populated by parsing the output of a multivariate modeling application such as Simca-P. The configuration dialogs can be used to prompt and obtain from the user the data items that cannot be parsed or computed.

The APC system can comprise a number of applications used during system operation, and the applications can include: a tool APC master application; an APC alarm application; one or more sensor interface applications; an APC database management support application; an APC data collection support application; an APC event management support application; a probe interface application; an APC process chamber support application; an APC strategy selection application; a tool interface application; a wafer data application; and an APC plan executor application.

In addition, the APC system can comprise debugging and diagnostic applications that can be executed from any seat on the network where the software is installed and these applications can be used to inspect, diagnose, debug, and/or modify the APC system. For example, the APC server 160 can perform file maintenance. Alternately, a workstation can perform file maintenance. Log files can be stored in the database 190 and used to troubleshoot problems with the APC system. These files can be kept for a limited amount of time. System errors and other causes of application failures can be found in the log files. For example, log files can include an alert log, which contains information such as system error messages and event timing; a tool event log, which contains event information; and an operating system log, which contains a history of activity on the APC server.

These logs can be configured for circular logging (deletion of the oldest data once the file has reached a certain size) so that maintenance is minimized.

Also, APC system 145 can comprise an interface application, which can communicate alarm and event information to a customer's Manufacturing Execution System (MES).

The interface server's messaging component can be used to provide the connection and message flow between applications. For example, application modules and user interfaces can use SQL messages to access and update information in the data hub(s).

A tool APC master application, for example, can comprise a set methods including: a shut down all method that can be used to clean up at shutdown; an initialization method can be used to initialize parameters; a Lgmgr boost method that can be used to boost the priority of the logic manager process; a load configuration method that can be used to load system configuration from the database; a load state method that can be used to load system state variables from the database; a save configuration method that can be used to save system configuration to the database; and an update GUI time method that can be used to update the GUI time variable.

In addition, a tool APC master application can use memory variables, and there can be two record formats associated with the tool APC master application: a system log request, which is the APC system log request record and an attribute Format record, which is a record format to hold data to go in and out of the attribute database table.

In addition, APC system 145 can comprise an APC alarm application that can process APC and tool alarms from the system. The APC alarm application can use at least one memory variable, which can be used to hold the alarm text for GUI display. An alarm file method can be used to write the APC and tool alarms into the alarm table in the database. The alarm file can comprise two parameters the alarm message and the event ID. The method calls the alarm TCL API and passes the alarm information. The alarm can be processed by executing an alarm management procedure. For example, when an alarm occurs, an email can be sent; an entry can be written into an alarm table in the persistent database, and alarm text can be displayed using a GUI status display. In addition, when the system recovers from an alarm, an entry is written to the alarm table, and a text message can be displayed using a GUI status display. Also, a user can view the contents of the alarm table through an alarm logs GUI screen.

Also, APC system 145 can comprise one or more sensor interface applications. For example, at least one OES data recorder can be used to record data from each optical emissions sensor, and there can be an OES device interface for each OES sensor associated with a processing tool. There can be a number of methods associated with an OES data recorder application including: a get sample method that collects the data and writes the data to a file; an initialize method that runs at startup; a setup method that sets up sensor for recording and opens a file for writing; a start device method to start the OES device connection; a start recording method to start recording data; a stop device method to stop an OES device connection; and a stop recording method to stop recording data, write to the control register and close the file.

In addition, an APC database management application can be provided, as a part of APC system 145, to perform daily data backups, data archives, and data deletions in the APC and SPCDB databases. (i.e., backups and archives can be compressed and zipped)

For example, a BADRR utility program can be configured to backup and purge the historical data points of the charts. The BADRRGUI module can contain several GUI panels that the user interacts with to determine how the data is to be processed. A backup function can be used to determine what data should be backed up (backup data consists of configuration data only not run wafer data). The archive function determines the data that should be archived. The delete function can determine what data should be deleted and process them one run ID at a time. Data can only be deleted after it has been archived. The restore function can take the current file stored in the backup directory, unzip it to a work directory and restore each table according to the file name. The retrieve function can take the selected file stored in the archive directory and process each file individually, unzip the file to the work directory and retrieve each table according to the file name. The reindex function can collect current statistics on tables and indexes; this can provide the optimizer with the most accurate information with which to determine the best access plan when retrieving data. The reorg function reorganizes a table by reconstructing the rows to eliminate fragmented data, and by compacting information. The reorg function can only be performed when the APC system is not collecting data.

An APC data collection support application can also be provided in APC system 145. The APC data collection support application can comprise a number of methods, including at least one of a get lot data function, a get wafer data function, a setup sensors function, a start sensors function, a stop sensors function, and a load default plans function.

In APC system 145, an APC event management support application can also be provided. The APC event management support application can be used to dispatch methods based on events. The APC event management support application can comprise a number of methods, including at least one of an active event method, file ready method, an alarm method, a lot end method, a lot start method, a recipe end method, a recipe start method, a RF off method, a RF on method, a wafer in method, and a wafer out method. Furthermore, a probe interface application can be provided as a part of the APC system. The probe interface application can be used to provide communication between a probe and the sensor interface, and can use a proprietary text-based protocol over RS-232.

For example, an SCNx=freq command can be issued during setup of a probe and triggered by the wafer in event. The variable x can be an index number ranging from 0 to 16. Frequency can be specified in Hertz. Recording can start when a recipe start event has been received. At this time, the SCN command can be issued on a fixed period (i.e., time between samples), the value of which can be stored in a register. When the SCN command is issued, the probe can return one line of data for each frequency specified with the setup command. Each line can contain frequency, time, status, voltage, current, phase, and impedance.

An APC process chamber support application can also be provided in APC system 145. The APC process chamber support application can comprise a number of methods including: a receive tool event method that receives an event from a tool agent and updates global memory, and an update state method that updates the state variables for a process chamber. The APC process chamber support application can comprise a number of memory variables including: a chambers variable that is used to describe the status of process chambers; a current lot variable that is used to describe the current lot running; and a run ID counter variable that is the part of the run ID that increments each time.

Also, APC system 145 can comprise a tool interface application. The tool interface application can manage the tool interface, file transfer, and general status. For example, a tool interface application can include a plurality of methods including a change event method that captures the event ID from the tool; a device failed method that is called by a device interface; a device recovery method that is called by a device interface; an active event method that receives the active event from the tool; a agent down cleanup method that runs when the agent communications are lost; a check active method that checks the status of the active flag in order to see if the agent has failed; an event dispatcher method that dispatches events to the proper methods; an event receiver method that gets triggered when a new unsolicited event is sent from the tool agent; a get tool record size method that finds the record size when it changes; a get trace data method that downloads the trace file from the tool; a start agent method that downloads the client agent to the tool to start communications; and a stop agent method that stops the agent client, as well as the agent.

APC system 145 can also comprise a wafer data application. The wafer data application can provide a simulated dynamic allocation of water data. Memory variables associated with the wafer data application include a wafer pool size variable that is set to the size of pool array, and wafer pool array that is the pool of wafer records. Methods associated with the wafer data application include a cleanup method that cleans up wafers after the tool interface is stopped, and an initialize wafers method that initializes the wafer pool to a known state.

In addition, APC system 145 can comprise an APC strategy selection application. The APC strategy selection application can use a memory variable, which can comprise the name of the strategy active for each chamber. For example, the APC strategy selection application can use a method, such as context matching to determine which strategy to run. Control strategy can be selected by a host computer by specifying a control strategy name or downloading a control strategy.

The operation of the APC system can be established using context driven strategies and plans. A strategy is used to define what should happen during a set of sequences on the APC system. This set of sequences can be associated with a lot, a batch, a wafer, a recipe, or a set of machine activities. A strategy can include a combination of processing, pre-processing, and post-processing activities. Each strategy can comprise a plurality of plans. The running control of a plan or set of plans can be called a control job.

A strategy can be a pre-defined script that is activated and deactivated based upon events. For example, a control job can set up a set of data collection and configuration plans for a wafer run in a processing chamber for a given context (lot, chamber, process recipe, etc.). A strategy can have specific behavior determined by wafer context. A strategy associated with a lot context that can run on multiple chambers can set up plan(s) for each module. Strategy context can be customized for: high priority lots; chamber qualification runs; foreign material monitoring; chamber conditioning; lot numbers; recipe names; process chambers; and combinations.

APC system 145 can further comprise an APC Plan Executor (PE) application that can be used to determine which strategy to run. For example, a strategy can specify a set of plans that should be active at any given time; events can be evaluated by the PE to determine a specific strategy to run; and the action can be executed in the form of plans. Plans can be specific actions that take place for a single wafer. The actions can be specified by a pre-defined script that manages sensor setup, data collection and data analysis for a given wafer, lot or set of wafer runs.

A PE application can start multiple plans concurrently. For example, at least one plan can be run for each chamber and at least one plan can be run for each tool. Plans can last for as long as the time between chamber cleanings, or as short as the time to run a single wafer.

FIG. 4 shows an exemplary relationship diagram for event contexts, strategies, control jobs, and plans in accordance with an embodiment of the present invention. Events, both internal and external, can be fed into the APC system and acted upon appropriately. For each interface that creates events, there can be a system application to accept the events and propagate them.

Figure 5:
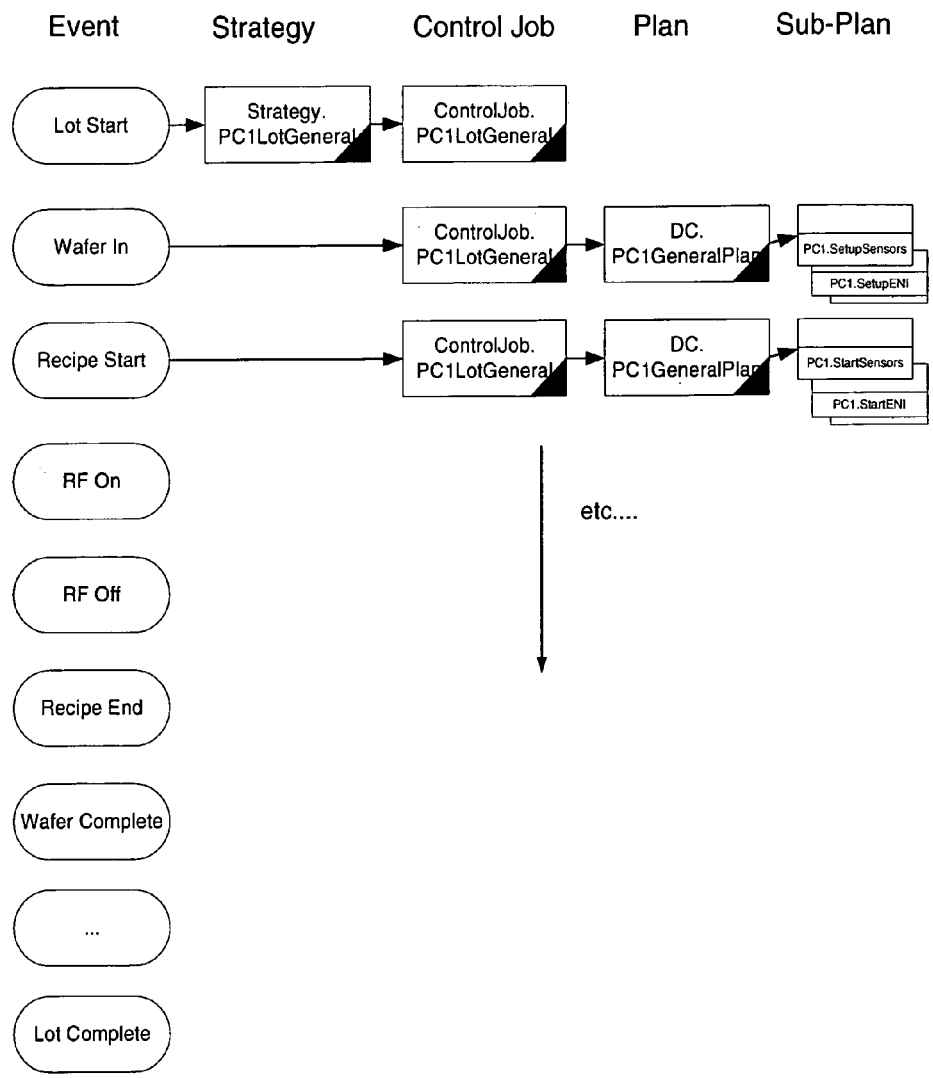
FIG. 5 shows an exemplary relationship diagram for event contexts, strategies, control jobs, and plans in accordance with an embodiment of the present invention.

FIG. 5 illustrates a simplified data flow diagram in accordance with an embodiment of the present invention. The flow of data from the tool and sensors to the relational database can be represented by a simplified data flow diagram as shown in FIG. 5. In the illustrated embodiment, arrows represent the events, and each arrow can be labeled by the event name. In this case, time flows from the top of the diagram to the bottom of the diagram. For example, the simplified data flow diagram shown in FIG. 5 can be used to illustrate the event and data flow between components during initialization, lot processing, and database management. Events can go directly to the interface server for processing and storage. The interface server can maintain a table of global state variables. Each event/alarm can be used to update the corresponding state.

Figure 6:
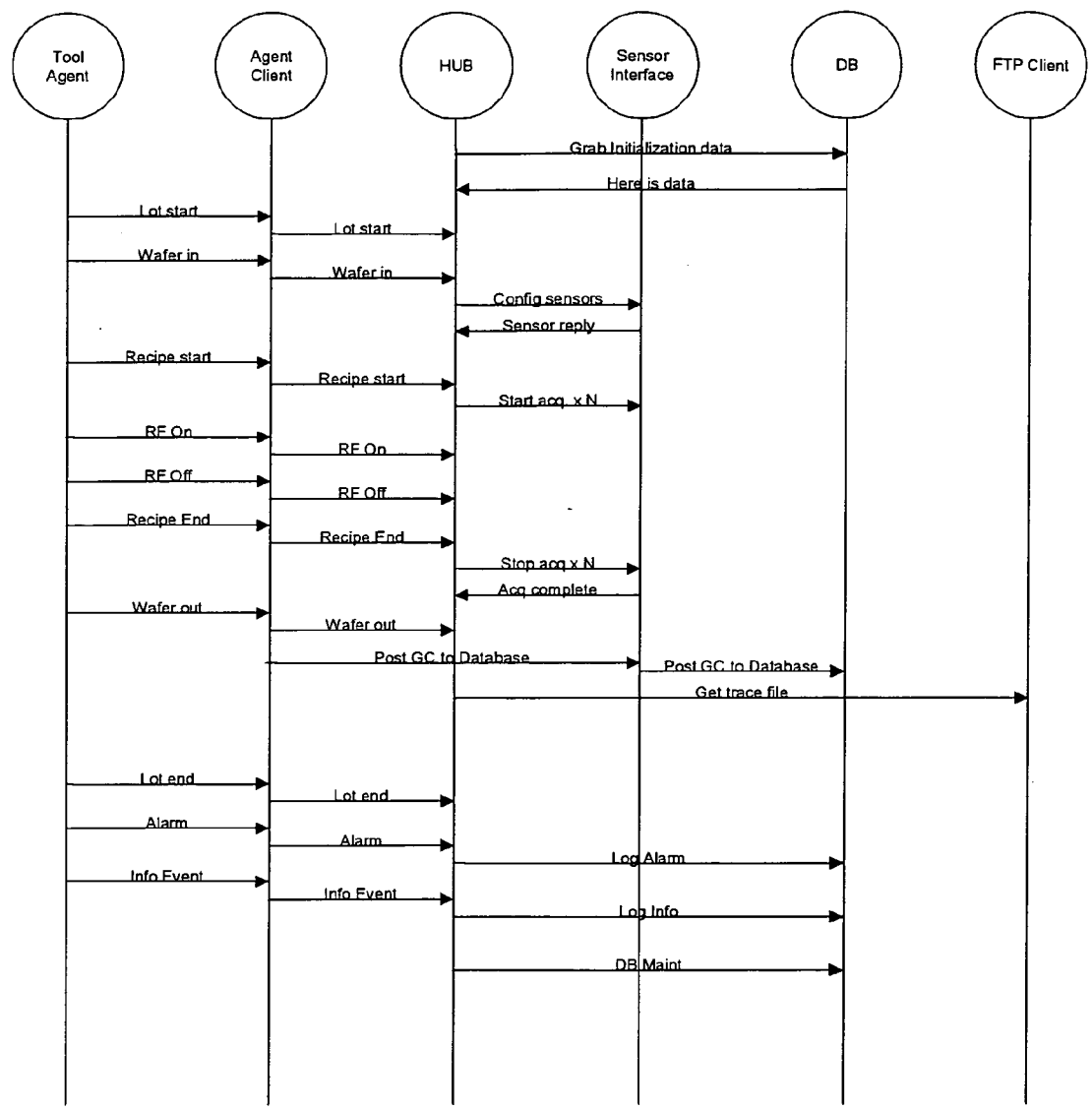
FIG. 6 illustrates a simplified data flow diagram in accordance with an embodiment of the present invention.
Figure 7:
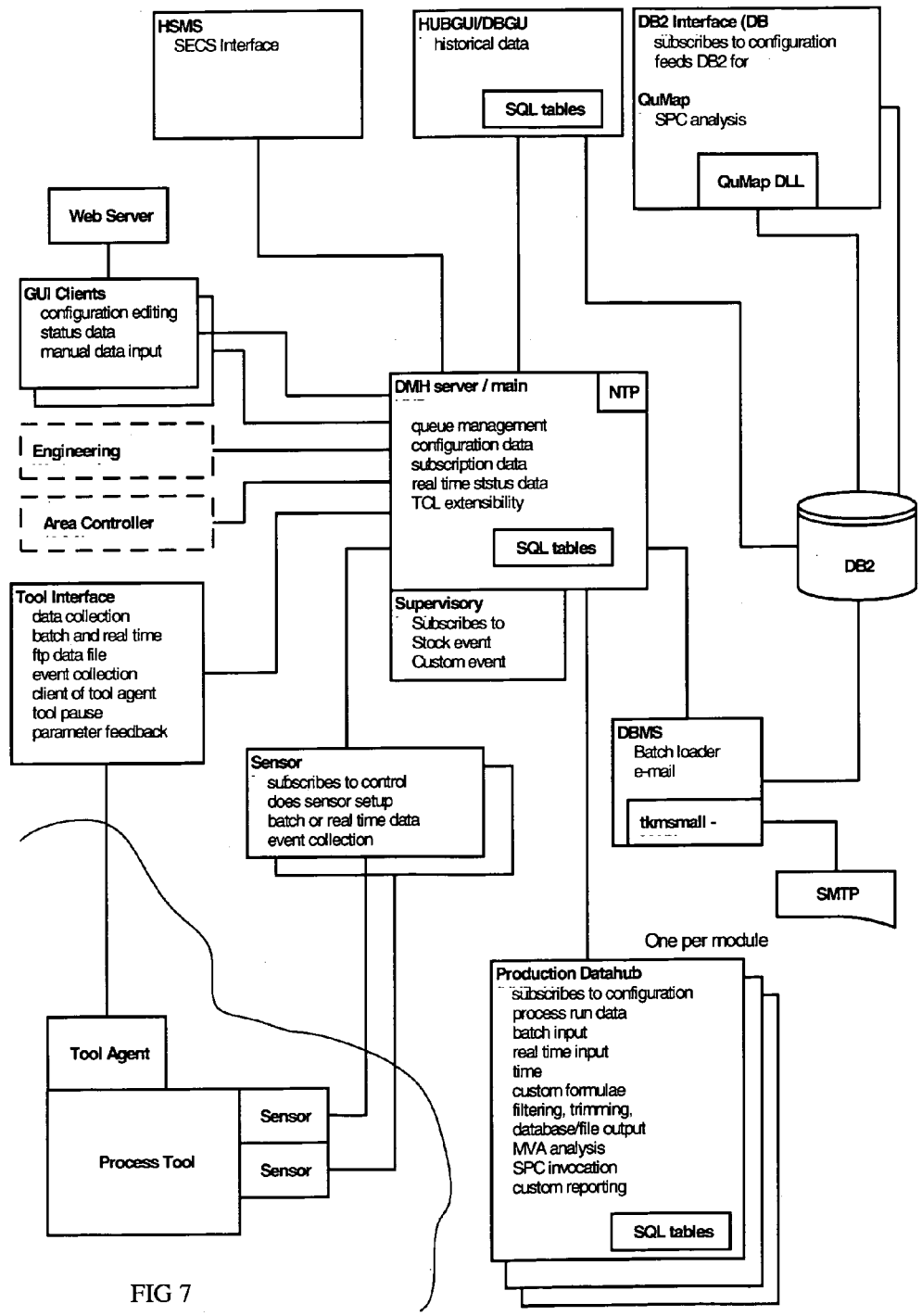
FIG. 7 shows an exemplary block diagram of an interface server in accordance with an embodiment of the present invention.

FIG. 6 shows an exemplary block diagram of an interface server in accordance with an embodiment of the present invention. In the illustrated embodiment, inter-process communication can be implemented using a Distributed Message Hub (DMH) message system. For example, a DMH system can use plain text messages to and from named message queues referred to as mailboxes. Callback logic can be executed when messages arrive in specified mailboxes. A DMH system can use asynchronous messaging and message queues to smooth over peak loads and reduce resource loading. In addition, a sensor interface and the database interface can be written as simple, single-threaded clients of the DMH message system server.

For example, a tool-related application can be used to interface with one or more processing tools. The tool application can comprise an agent client that can be used as the interface for events originating from a tool. The agent client can process the events, when the events are received from the tool agent running on the tool. The tool application can comprise an event receiver method, which can be triggered by unsolicited data from the agent client. The data can come to the event receiver method in the form of a blob, which can be mapped directly into a record format. In addition, the event receiver can map the tool record into an array record in a process chamber application, and call a dispatch events method. This event can then be propagated to the strategy and control job applications.

As events are being propagated through the APC system, some objects can react by changing states. For example, a lot state machine or a batch state model can be used. A lot state machine can be on (for lot processing), and off (for lot idle), and a batch state machine can be on (for batch processing), and off (for batch idle).

In addition, a tool state machine can be used. For example, the tool states can include tool ready, tool running, tool pause, and tool stop. When a fault is detected, the tool can be paused or stopped depending on the severity of the fault. When the tool is paused, the GUI component can be used to display a choice of next action for the APC user to respond to. Also, the GUI component can display a control chart leading up to the fault triggering tool pause, a top-5 list of possible causes, and offers a choice of next action—view the raw data of the fault wafer, view the principal component score scatter plot of the fault wafer, view the contribution chart of the fault wafer, view the summary data history of wafers processed with the same recipe as the current fault wafer, specify the data to be viewed by inputting search keys, check sensor, and skip analysis and clear tool pause, skip analysis and take the tool off-line for maintenance. The APC user is responsible for making judgment to clear the pause.

Furthermore, a process chamber state machine can be established for each process module (PM 120 FIG. 1). For example, a process chamber object can have three state variables: usage state, in use state, and recipe state. Exemplary chamber states can include 'Idle', 'InUse', 'Ready', 'Processing', 'Plasma NotActive', 'PlasmaActive', and 'RecipeComplete'.

For the general case, each data recorder object can be enabled at the start of a sensor and turned off at the completion of a wafer. In some cases, data may be recorded between wafers (environmental data—transfer chamber vacuums, temperatures, humidity, etc. . . . .). In this case, the recorder objects can have multiple outputs of data associating the data to a wafer at one sample rate and to a machine object at a different sample rate (configurable).

In addition, APC system 145 can comprise a control execution component that contains the main interfaces used to invoke APC functionality and the objects that describe and direct process control. Ultimately, this component executes control strategies.

In one embodiment, at least one of the applications can be configured to run as a Windows NT service. As such, the application starts with the system boot, without a user logon; the application stays running while users logon and logout; the application can be configured to not interact with the user's display; and the application can use a different logon account with security credentials that differ from those of the logged-in user.

In addition, the APC system 145 can comprise a virus protection component. For example, virus protection software can be installed on APC server 160, and client workstation 170, and the LAN connection can be used to perform updates on a scheduled basis.

Furthermore, the APC system 145 can comprise an on-line Help component that can be coupled to one or more GUI screens. For example, Help screens can be accessible to a user, and help files can be provided in PDF (Portable Document Format) and/or HTML format.

The APC system applications are tolerant to failures and service related disruptions. Additionally, the applications provide setup and trouble shooting capability. For example, when a disruption occurs, the APC system applications can detect the disruption and initiate the correct behavior to minimize the loss of data. In this way, the risk to the customer of producing product while the APC system is operating at a decreased functionality can be reduced.

The APC system is implemented using a configurable system that enables customers (end users) to add tools, chambers, and sensors. The APC system provides a development environment and methodology that enables customers to customize the data management applications.

The TEL Ingenio TL APC software provides a number of functions—fault detection and classification (FDC), E-diagnostics service, and run-to-run (R-2-R) control. FDC operates by comparing the current process results with historical data and generates notifications and interventions depending on the level of fault detected. R-2-R provides both feedforward and feedback control loops to adjust process recipes and to maintain the process model over time.

Figure 8:
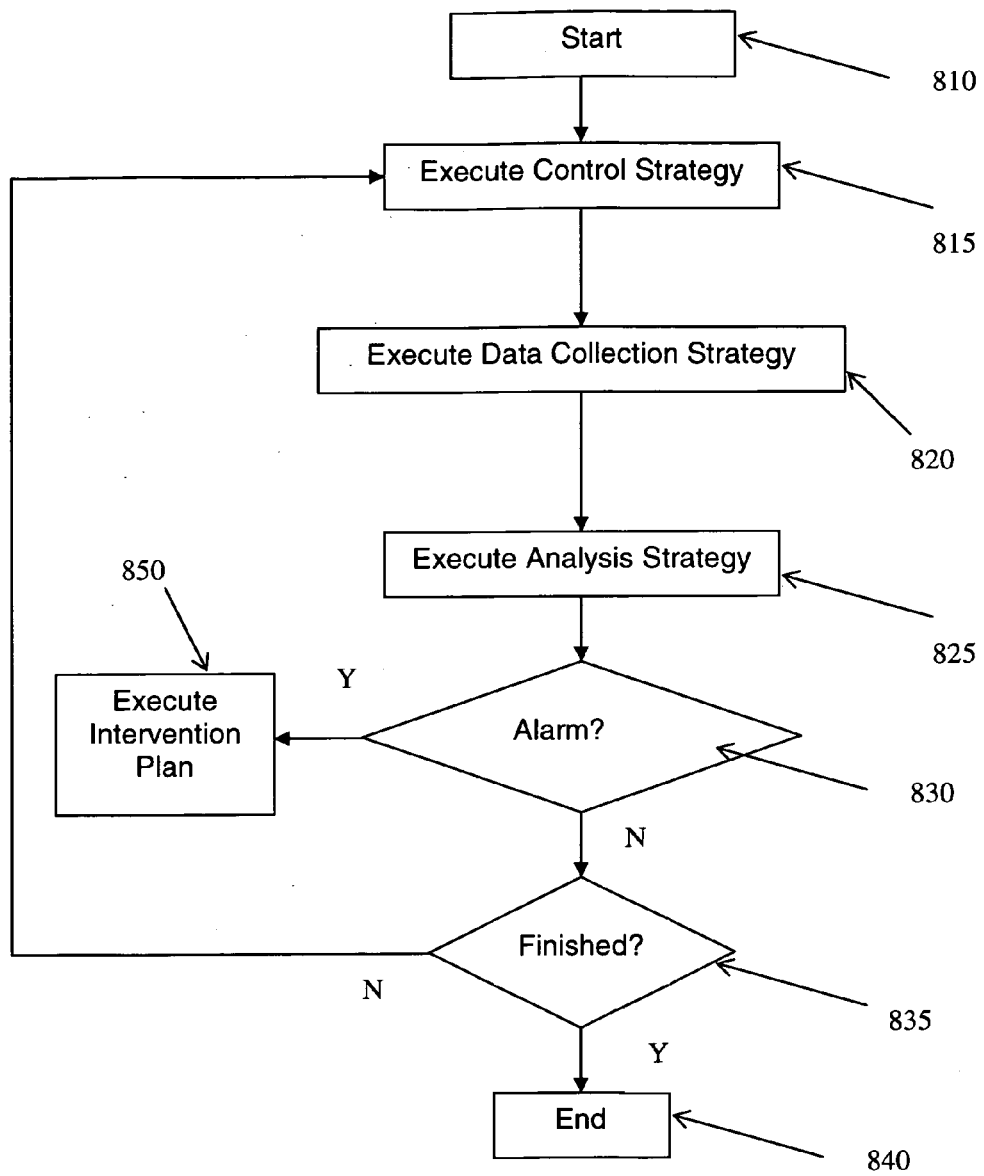
FIG. 8 shows a simplified view of a flow diagram for a monitoring process for processing tools in a semiconductor processing system in accordance with one embodiment of the present invention.

FIG. 8 shows a simplified view of a flow diagram for monitoring a processing tool in a semiconductor processing system in accordance with one embodiment of the present invention. The software and associated GUI screens provides a simple, user-friendly procedure for monitoring one or more processing tools in the system. Procedure 800 can be performed for each production step being performed by a processing tool in the semiconductor processing system. Alternately, procedure 800 can be performed for a set of production steps performed by a processing module in the semiconductor processing system. A production step can be an etching process, a deposition process, a diffusion process, a cleaning process, a measurement process, a transfer process, or other semiconductor manufacturing process.

In 810, a start event can be received. For example, a processing tool controller can send a start event to the APC system. Alternately, another computer, such as a host, can send the start event. A start event can be a point in time when a process or recipe step starts and can be context-based. For example, wafer in, recipe start, process start, step start, module start, and tool start can be start events. Also, a start event can occur when a wafer enters a processing chamber. Alternately, a start event can occur when a wafer enters a transfer chamber or when a wafer enters a processing system or when data is available from a host or IM.

A control strategy can define what happens during a set of sequences on a processing module and/or a processing tool. A control strategy can define a set of sequences for a single wafer, a single tool, a single lot, or a combination of tool activities. A control strategy can include a combination of processing activities, and a control strategy can be associated with a context. Desirably, context information is used to associate a given operation with another operation. In particular, the context information associates a process step or recipe with one or more strategies and/or plans.

In 815, a control strategy is executed. The control strategy can be context-driven in that the user can define one or several context items that will affect when the control strategy is selected. Control strategies can be defined at the system/tool level, not at the process module level. This is necessary since R2R control usually includes wafer passes through multiple IM and process modules. One control strategy is executed for a given wafer. If the context of a given wafer matches multiple control strategies, then the first matching control strategy can be chosen.

Control strategies can be evaluated on a "wafer by wafer" basis. A control strategy can be designated as enabled or disabled. A control strategy will not run when it is disabled. A control strategy can be designated as simulation, in which case, all its control plans can be executed in simulation mode, which means that no recipe change will be made on the tool.

The control strategy may contain multiple control plans. This will allow the execution of several control models for a given wafer. However, a single control plan must be designated as the control plan that will actually make a recipe change on the tool. The other control plans can be executed in simulation mode.

The context-sensitive control plan defines what control actions are to be taken when a processing system/tool processes wafers. For example, the context of a control plan can be limited to the choice of a single processing system recipe only.

Control plan information can be stored in the in-memory tables and inside DB2. The control plan can contain a model that can be used to achieve R2R control. The system recipe and other context shall be inherited from the parent control strategy. The control plan can comprise an integration section, a control section, and an algorithm section. The integration section can determine which modules are the source of control data and the target of R2R control. The control section can provide support for multiple feed-forward variables. The algorithm section can provide support for different types of control models.

Control plan can contain the control model. When multiple control models are executed at the same time, outputs from the previous model may be used as inputs to the second model. If the output from a control model changes a parameter that was set by a previous control model in the same execution cycle, then an alarm message can be generated and the new setting used. A process module can comprise one or more control plans, and one control plan can provide data to another control plan in a process module or with other process modules.

The control plans contain the information necessary to select the control model(s) to be executed. Control plans are associated with one and only one process module. Therefore, there needs to be a control plan for each process module that is being controlled.

The control plan can specify the minimum and maximum range that a control model can use. Control module ranges may over lap. If no minimum and/or maximum range are entered by the user, then the missing range can be unlimited.

A control plan is generally related to a process module and recipe combination. When a tool allows multiple system recipes to include the same process recipe, multiple control strategies can share a control plan. There may be different process module recipe limits for different process module recipes. Each control plan can independently set the recipe constrains to be used for the recipe modifications to be sent to the tool.

Predictive models can represent experiment-based or theory-based models. The predictive Exponentially Weighted Moving Average (EWMA) method is one of the theory-based predictive methods with some constraints. A Partial Least Squares (PLS) regression method can be used to generate a model based on experimental results. Model filter implementation may be required for correcting the model predictive error.

The outlier rejection filler can be defined in the control plan. The user can set the minimum number of points required to perform control. If the minimum number of points is not provided or a site is eliminated because of the filtering, an alarm shall be generated at run-time.

A minimum and maximum control range may be specified for each control model used by the control plan. If the minimum value is not specified, then there is no minimum range for the control model. If the maximum value is not specified, then there is no maximum range for the control model. One or more control models may match fulfills the selection criteria. If more than one control model matches, all matching control models will be used at run-time. If there are no control models that fulfill the selection criteria, than a run-time alarm shall be generated and the plan will decide if the module is to be paused, a "NULL" recipe used or the nominal recipe used.

When a new wafer to be controlled enters the system the control recipe(s) that match the system recipe and wafer context are selected. When the metrology data is received, the first matching control strategy can process the metrology data and remove any outlier data points using the selected outlier method. The APC system (R2R controller) can then select the control model(s) that corresponds to the metrology data. The control model(s) are then executed and calculates the parameter settings to be sent to the tool. These settings can then be sent to the tool and saved in DB2 and flagged as the settings used for this wafer. Then other matching control strategies can be processed and the results also saved in DB2 but not sent to the tool.

If an exception is found during the processing, an alarm can be generated and sent to APC system (TL controller).

For example, a control strategy can be named ControlStrategyA1 and can comprise four sequences that are performed at different times. Sequence 1 can be a hard mask CD process performed in a metrology module using a first metrology recipe; sequence 2 can be a hard mask etch process performed in a process module using a first etch recipe; sequence 3 can be a poly CD process performed in a metrology module using a second metrology recipe; and sequence 4 can be a poly etch process performed in a process module using a second etch recipe.

In 820, a data collection (DC) strategy is executed. APC system executes DC strategy that is defined for the control strategy, applying DC plan filters and executing summary calculations based on a process context. The process context can be dependent upon the production step being performed and/or the chamber being monitored. The context determines which strategy and/or plan is executed for a particular process recipe. For example, if a recipe contains a context term "hard mask CD", then DC strategies associated with the "hard mask CD" context term can be executed when process tool runs processes with any recipe that contains the context term (element) "hard mask CD".

During runtime, a start event can cause the APC system to lookup the current context data, determine which strategies match the context, determine which plans to run, and invoke their corresponding scripts. A control strategy record can contain context-matching information such as wafer-run, tool, chamber, recipe, slot, etc. For example, the APC system can compare the runtime context information and try to match it against a database of strategies. Each control strategy can contain at least some of the following context information: tool ID, lot ID, chamber ID, cassette ID, slot ID, wafer ID, recipe ID, control job ID, process job ID, start time, end time, step number, state, maintenance counter value, product ID and material ID.

The process context can be dependent upon the process being performed and the tool being monitored. In context matching process, search order can be important. For example, the search can be executed by using the precedence order in GUI table. Search can be implemented using SOL statements. Once a strategy is identified, data collection plan including a sensor plan, data preprocessing plan and judgment plan can be automatically determined. The data collection plan ID, data preprocessing plan ID, and judgment plan ID can be sent to "execute control strategy" modules. If a matching strategy does not exist when the compare process context function is performed, then the software displays an error message in the fault field in tool status GUI screen and popup windows can be used to allow a user to correct the error.

Context can be defined by a combination of the context elements. For example, context can be an array of the context elements in a pre-determined order, or context may be a set of name-value pairs in a dictionary form.

In addition, the plans associated with the DC strategy are executed. At least one of a data collection plan, a data pre-processing plan, and a judgment plan can be executed. In addition, a sensor plan, a parameter select plan, and a trim plan can also be executed.

Data collected during production runs that yield high quality product can be used to establish "good tool state" data, and data collected subsequently can be compared with this baseline data to determine if a tool is performing correctly in real-time.

A control strategy can be established to determine tool health status as part of the Quality Control (QC) testing. A control strategy and its associated plans can be executed to ensure that a system or a portion of the system such as a processing tool is operating properly. For example, a tool health control strategy and its associated plans can be executed at a prescribed time or when a user schedules one. When a tool health control strategy and its associated plans are being executed, diagnostic wafer data can be collected. A diagnostic, dummy, product, or test wafer can be processed, and the context can be tool, module, or sensor diagnostics.

A control strategy and its associated plans can be established for process module preparation processes, such as seasoning-related processes. For example, after a cleaning process (i.e., wet clean) a number of dummy wafers can be processed using seasoning related strategies, plans, and recipes. A user can use the strategies and plans that are part of the APC system, or a user can easily and quickly develop new seasoning-related control strategies using the APC system. A user may try a set of different seasoning data collection plans and recipes to determine which seasoning recipe has the best detection power. The data from these seasoning runs can be used to further refine process and tool modeling.

A control strategy and its associated plans can be established for process module characterization processes, such as chamber fingerprinting. For example, after a maintenance process a number of dummy wafers can be processed using fingerprinting-related data collection plans and recipes. The data from these fingerprinting runs can be used to further refine process and tool modeling. The fingerprinting data can be used for analysis to identify the best model that minimizes the critical chamber mismatches that affect the on-wafer process results.

Static and dynamic sensors are setup when a data collection plan is executed. The data collection plan can comprise a sensor setup plan. For example, the start and stop times for the sensors can be determined by the sensor setup plan. The dynamic variables required by the dynamic sensors can be determined by the sensor setup plan. A recipe start event can be used to tell a sensor to start recording. A wafer in event can be used to setup a sensor. A recipe stop event or a wafer out event can be used to tell a sensors to stop recording.

The data collected and the sensors being used are dependent upon the DC strategy context. Desirably, different sensors can be used and different data can be collected for product wafers and non-product wafers. For example, tool status data can be a small portion of the data collected for a product wafer, and tool status data can be a large portion of the data collected for a non-product wafer.

The data collection plan also includes a data preprocessing plan that establishes how the expected observation parameters are to be processed with respect to spike counting, step trimming, value thresholds, and value clip limits.

When the data preprocessing plan is executed, time series data can be created from raw data files and saved in the database; wafer summary data can be created from the time series data; and lot summary data can be created from the wafer data. The data collection can be executed while the wafer is being processed. When the wafer is out of this process step, then the data pre-processing plan can be executed.

A data collection plan is a reusable entity configured by the user to collect the desired data. The data collection plan consists of the configuration of one or more sensors on one or more separate process modules. The plan also includes the selection of the data items that should be collected by the associated sensors, and which of the data items are to be saved.

A sensor can be a device, instrument, processing tool, process modules, sensor, probe, or other entity that either collects observation data or requires software setup interaction, or can be handled by the system software as if it is a sensor. For example, processing tools and process modules can be treated as if they are sensors in data collection plans.

Several instances of the same sensor type can be installed on a tool at the same time. The user can select the specific sensor or sensors to use for each data collection plan.

Data collected in the system flows through a set of steps between the real-time sensor collection and the database storage. Data collected can be sent to an interface server that can comprise a real-time memory SQL database. The interface server can provide a physical location for the data to be processed by different algorithms defined by the user through plans in the APC system and by scripts defined by the user.

The APC system provides independent data collection modes and setup modes for each process module; that is, each process module can be independent of any other process modules, and the setup of one process module does not interrupt the data collection of other process modules. This minimizes the amount of non-productive time for the semiconductor processing system.

When a DC strategy comprises a judgment plan, the judgment plan is executed. The execution can be rule based and comprise SQL statements. A start event judgment plan can be executed after a "start event" occurs, and an end event judgment plan can be executed after an "end event" occurs. For example, when a start-event judgment plan is associated with a control strategy, it can be executed after a start event such as a wafer-in event, a process start event, or a recipe start event. A start event judgment plan can be part of the alarm management portion of a tool status monitoring system.

When an alarm occurs (i.e., a fault is detected) after a start event, a judgment plan associated with a control strategy can send messages and/or instructions to an intervention plan to take the following actions, display a fault message on a status screen, write a fault message in a log file, send a pause next wafer message, send a pause next lot message, send warning message to the tool, and email to the tool owner.

Figure 9:
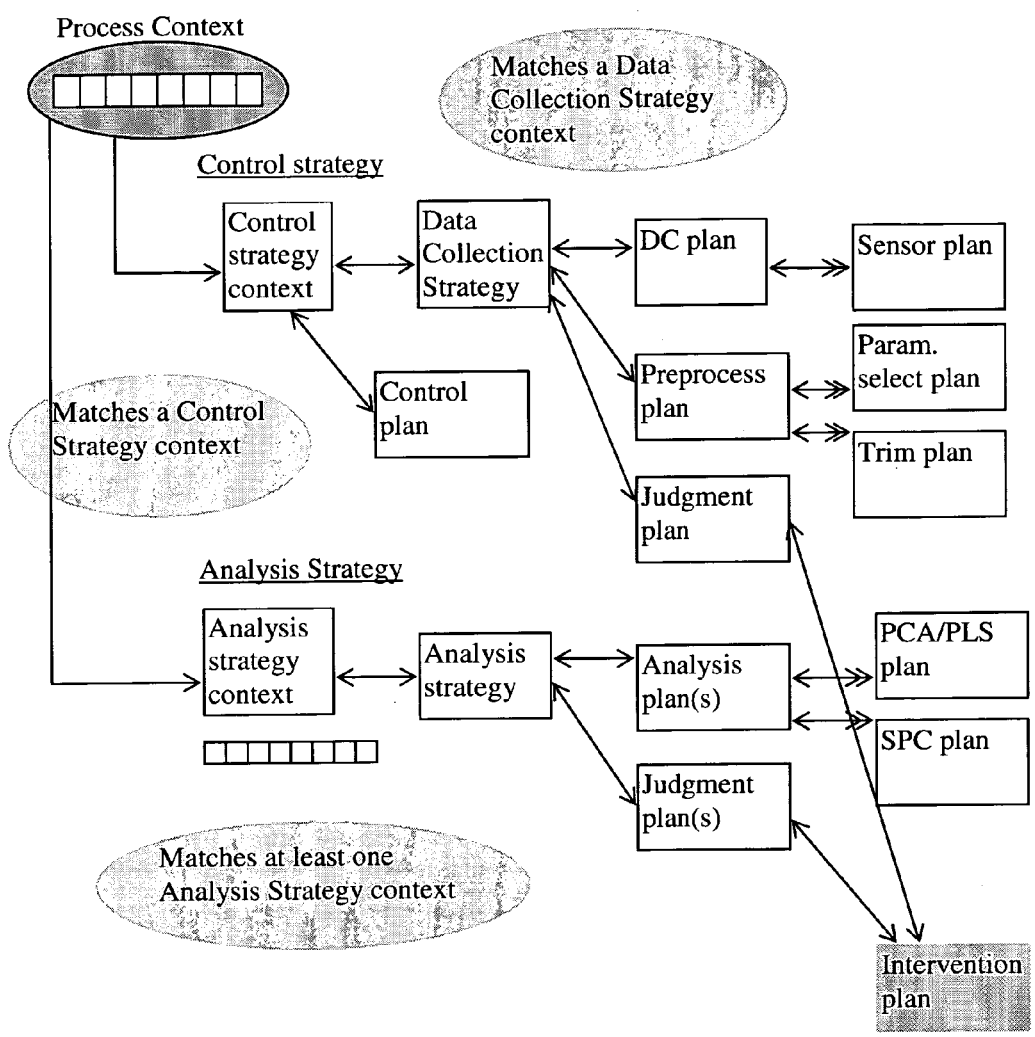
FIG. 9 shows an exemplary relationship diagram for strategies and plans.
Figure 10:
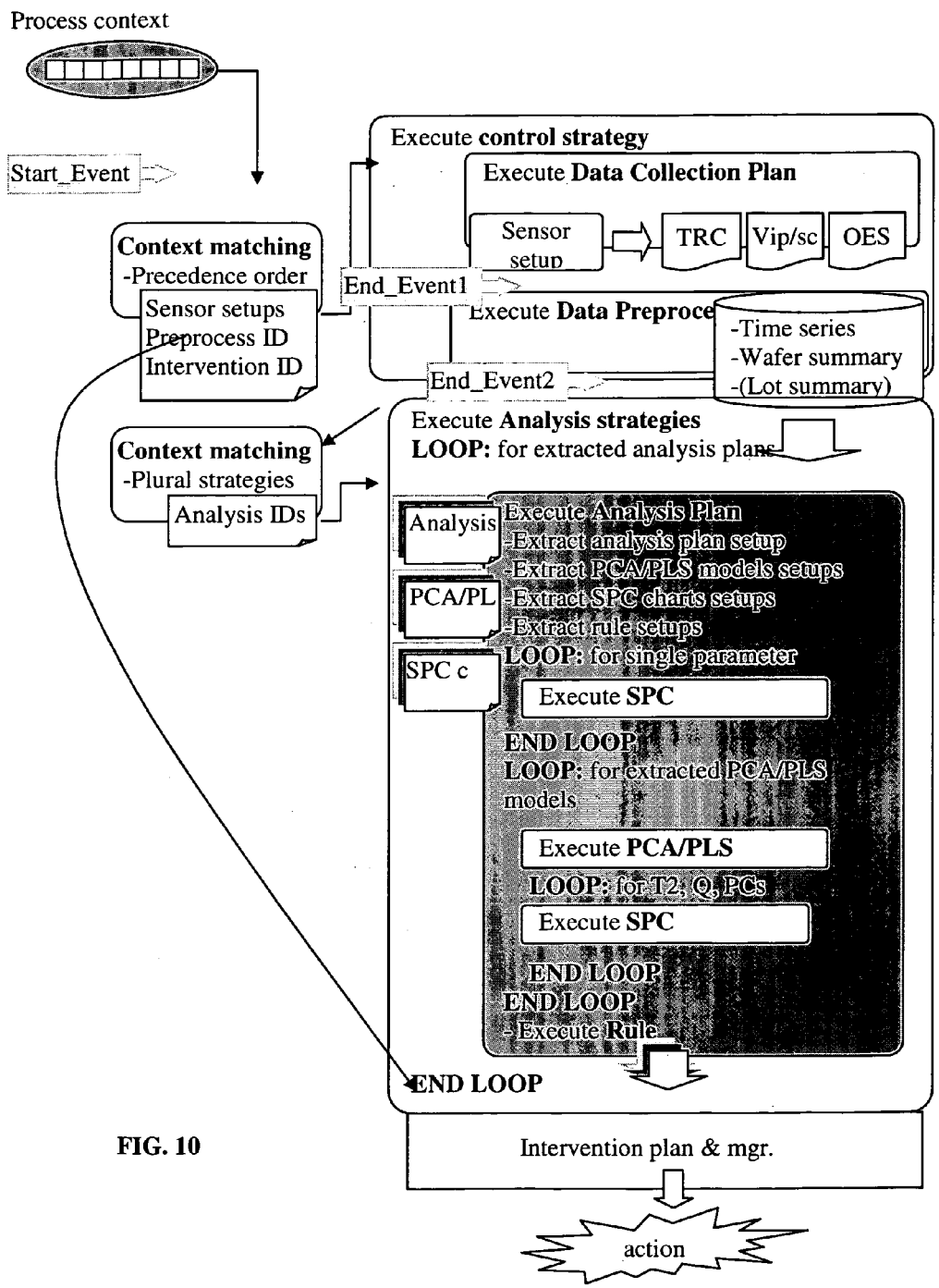
FIG. 10 shows another exemplary relationship diagram for strategies and plans.
Figure 11:
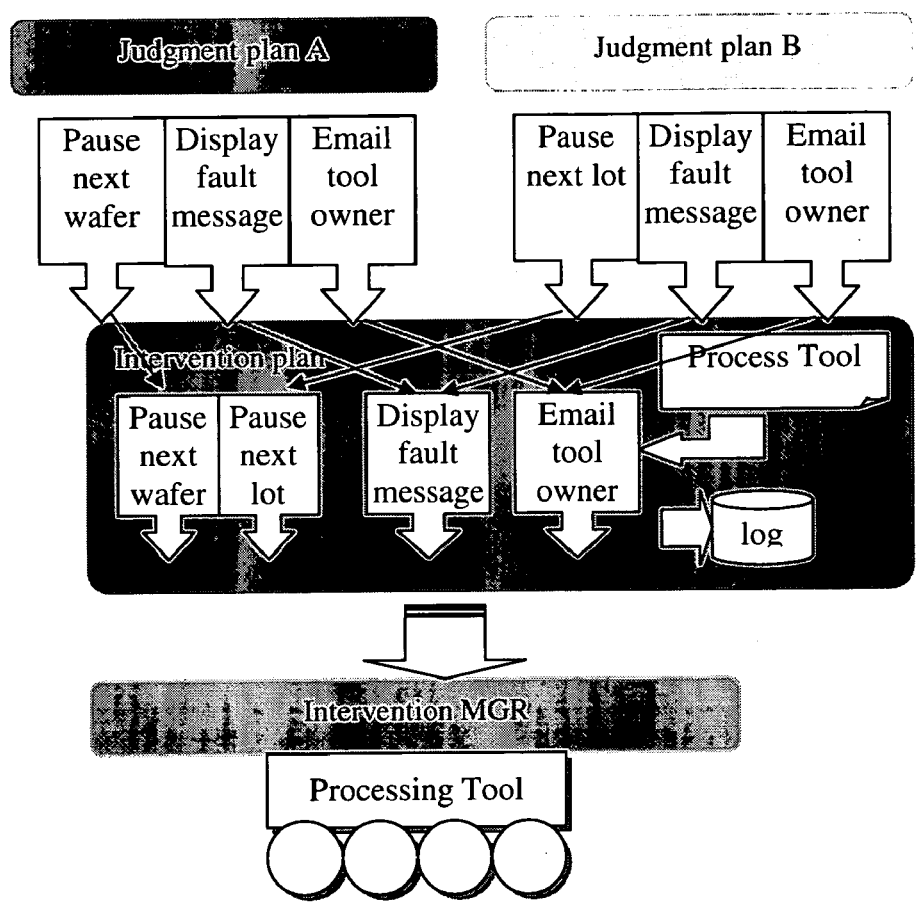
FIG. 11 shows an exemplary relationship diagram for judgment plans and intervention plan in accordance with one embodiment of the present invention.

Judgment plans operate independently. Each judgment plan does not need to know the actions in other judgment plans. As a result, there can be some redundancy or inconsistency in actions, and an intervention plan can be used to resolve any problems. Exemplary relationship diagrams for strategies and plans are shown in FIG. 9 and FIG. 10, and an exemplary relationship diagram for judgment plans and intervention plan is shown in FIG. 11.

In 825 (FIG. 8), the analysis strategy can be executed, based on a process context. The process context can be dependent upon the production step being performed and the tool being monitored. The context determines which analysis strategy and/or plan is executed for a particular process step. For example, to associate an analysis strategy with a process type such as "Hard Mask CD", the context for the analysis strategy should contain the context term "Hard Mask CD".

An analysis strategy can be a holder of plans. An analysis strategy and the associated plans "analyze" the data after collection.

In one embodiment, a process context can be compared with a list of analysis strategies. For example, APC server 160 (FIG. 1) gets the current process context as a string when a "process start" event occurs. The process context can be compared with the list of analysis strategies, and then the proper strategies are identified.

In this process, search order can be important. For example, the search can be executed by using the precedence order in GUI table. Search can be implemented using SQL statements. When an analysis strategy is identified, at least one of a Statistical process Control (SPC) plan, a Partial Least Squares (PLS) plan, a Principal Component Analysis (PCA) plan, a Multivariate Analysis (MVA) plan, a Fault Detection and Classification (FDC) plan, a judgment plan, and a user defined plan can be automatically determined. The analysis plan IDs, and judgment plan IDs can be sent to "execute analysis strategy" modules. If a matching strategy does not exist when the compare process context function is performed, then the software can display an error message in the fault field in tool status GUI screen and popup windows can be provided to a user to identify the correct strategy to use.

There can be multiple analysis strategies that match a run context, these analysis strategies are executed at a particular time for a particular processing tool. The user determines the order of the strategies within a specific context by moving the strategies up or down on the list. When the time comes for the strategy to be selected, the software can start at the top of the list and goes down the list until it finds the first strategy that matches the requirements determined by the context and executes that strategy first.

In addition, there can be multiple plans in each analysis strategy, and the user determines the order of the plans within an analysis strategy by moving the plans up or down on the list. When the time comes for the plans to be executed, the software starts at the top of the list and goes down the list.

One method for using context-based execution can be to do context matching. For example, when executing context matching, the context of the wafer currently being processed can be used. Alternately, the context of a substrate or other semiconductor product currently being processed can be used. When the context is determined, it can be compared with the context of analysis strategies. When a context match occurs, one or more analysis strategies can be executed.

When an analysis strategy is executed, analysis plans and judgment plans are identified. For example, a context-matching execution software module can be used that allows for the dynamic setup and invocation of at least one analysis strategy. In one case, a wafer-out event can trigger a system controller to lookup the current context data, determine which analysis strategies to run, and invoke the corresponding scripts to determine the associated plans.

In addition, the plans associated with the analysis strategy are executed. When the analysis plans are executed, at least one of a SPC plan, a PLS plan, a PCA plan, a MVA plan, a FDC plan, a judgment plan, and a user defined plan can be executed. Analysis performed on data collected during production runs that yield high quality product can be used to establish a "good tool state" model, and data collected subsequently can be analyzed using this baseline model to determine if a tool is performing correctly in real-time.

An analysis strategy can be established to determine tool health status as part of the Quality Control (QC) testing. For example, a tool health analysis strategy and its associated plans can be executed to ensure that a system or a portion of the system such as a processing tool is operating properly. A tool health analysis strategy and its associated plans can be executed at a prescribed time or when a user schedules one. When a tool health analysis strategy and its associated plans are being executed, diagnostic wafer data can be analyzed using diagnostic models, where the diagnostic models can include SPC charts, PLS models, PCA models, FDC models, and MVA models.

An analysis strategy and its associated plans can be established for process module preparation processes, such as seasoning-related processes. For example, after a cleaning process (i.e., wet clean) the data collected from a number of dummy wafers can be analyzed using seasoning related models. A user can use the analysis strategies, plans, and models that are part of the APC system, or a user can easily and quickly develop new seasoning-related analysis strategies, plans, and models using the APC system. A user may try different analysis models to determine which seasoning related model has the best detection power. The analysis results from these seasoning runs can be used (fed back) to further refine the control strategies and data collection plans.

An analysis strategy can be established for process module characterization processes, such as chamber fingerprinting. For example, after a maintenance process the data collected from a number of dummy wafers can be analyzed using fingerprinting-related models. The analysis results from these fingerprinting runs can be used (fed back) to further refine the control strategies and data collection plans. The analysis results can be used to identify the best model that minimizes the critical chamber mismatches that affect the on-wafer process results.

When a strategy comprises a judgment plan, the judgment plan can be executed. The execution can be rule based and comprise SQL statements. A start-event judgment plan can be executed after a "start event" occurs, and an end-event judgment plan can be executed after an "end event" occurs. For example, when an end-event judgment plan is associated with an analysis strategy, it can be executed after an end event such as a wafer-out event, a process stop event, a recipe stop event, a batch-out event, or a lot-out event. An end-event judgment plan can be part of the alarm management portion of a tool status monitoring system.

When an alarm occurs (i.e., a fault is detected) after a end event, a judgment plan associated with an analysis strategy can send messages and/or instructions to an intervention plan to take the following actions: display a fault message on a status screen, write a fault message in a log file, send a pause next wafer message, send a pause next lot message, send warning message to the tool, and email to the tool owner.

Judgment plans operate independently. Each judgment plan does not need to know the actions in other judgment plans. As a result, there can be some redundancy or inconsistency in actions, and an intervention plan can be used to resolve any problems. An exemplary relationship diagram for judgment plans and intervention plan is shown in FIG. 10.

In 830, a query can be performed to determined if an alarm has been produced. When an alarm has occurred, procedure 800 branches to 850. When an alarm has not occurred, procedure 800 branches to 835. In 850, an intervention plan can be executed. The intervention plan executes the following processes: get messages (judgments) from each judgment plan; categorize actions from different judgment plans; attach process condition like tool ID, recipe ID, recipe start time, etc. for email and log; save log file/database; and send proper message to intervention manager.

Intervention strategies are defined as the action the user chooses to take as the result of data analysis. For example, these actions can include: flag a suspect wafer or lot and notify a system owner and/or tool owner; page or e-mail an engineer to review the data and make a decision; inhibit the tool from processing wafers until the data has been reviewed and the inhibit released; stop the tool or take the tool "off-line" which can purge the remaining wafers from the tool; and trigger chamber cleaning or maintenance procedures.

Desirably, only one intervention plan executes during each process step. Intervention plan execution can be implemented in the APC server. For example, an intervention plan can get information (strings) from judgment plans. This information can include a Judgment plan ID, messages with suggested actions, fault messages, recovery messages, and action lists.

After the intervention plan is executed, messages on proper actions are sent to intervention manager. For example, action candidates can include: display a fault message on a status screen; send message to pause the process before the next wafer; send message to pause the process before the next lot; send pause or stop message to one or more tools, send pause or stop message to one or more process modules, send pause or stop message to one or more sensors, send email to a system owner, tool owner, process owner. For example, a "stop" message can be used to tell the tool to continue processing the wafers already in the tool, and an "abort" message can be used to tell the tool not to process the wafers in the tool and to send them back to the carrier.

In some cases, the APC system can intervene and respond to a problem without human intervention. In other cases, human intervention is required. For example, a user can access the data from the APC system to determine the nature of the fault, and the user can decide to continue with the process or terminate it. If the user terminates the process, then a tool can be put into repair state. The user can trigger this from the tool screen. For example, a user can decide to do a chamber wet clean. After wet clean, check, and process test, the process can resume with the next wafer. During the execution of the intervention plan and analysis plan, the APC system can present "tool health" charts to the user. For example, the charts can include manometer data, mass flow data, leakage data, pump data, gas system data, cassette system data, and transfer system data. The charts can display real-time data, historical data, and the combination of real-time and historical data for one or more tools, one or more modules, one or more wafers, one or more process steps, and for different times.

In 835, a query can be performed to determined if the process has finished. When the process has finished, procedure 800 branches to 840, and procedure 800 ends. When the process has not finished, procedure 800 branches to 815, and procedure 800 continues as shown in FIG. 8.

The APC system can be used to detect and classify tool errors when a tool is not in production; detect and classify tool errors during production; detect and correct tool errors during production; predict tool errors before production; and predict tool errors after production. For example, the tool status monitoring system can interface with processing tools which perform a number of self monitoring functions such as auto setup functions, auto check functions, and self check functions. When the tool sends the machine events in real-time, the monitoring system monitors the data in real-time, and when the tool sends the data in non-real-time the monitoring system processes the data as soon as the tool sends the data (i.e. data stored in the machine logs). Tool data can include information such as leak-rate check, zero offset, history events, alarm information, and process log data.

The APC system can comprise strategies, plans, and baseline models that can be used in generic fault detection and classification applications, chamber fingerprinting applications, seasoning completion applications, consumable life predictions, wet clean cycle applications, and the diagnostic applications for parts assembly. In addition, the APC system can collect and analyze the ARAMS (Automated Reliability, Availability and Maintainability Standards) logs from a processing tool. The APC system can perform this data collection as a part of a data collection plan.

The APC system can comprise strategies and plans for collecting and analyzing maintenance data. The data collection plans include consumable parts and maintainable parts. For example, these parts can include focus rings, shield rings, upper electrodes, etc. Maintenance data strategies and plans are dependent on tool type, process module type and number, etc. Default maintenance data strategies and plans can be configured automatically as part of the tool setup, process module setup, and add-on sensor setup information. A user can change the default settings.

The APC system can be used to provide wafer-to-wafer intervention, batch-to-batch intervention, or lot-to-lot intervention.

The APC system 145 can also comprise analysis and modeling applications that can be used to correlate data collected from various sensors to some characteristic of the process or wafer. For example, applications can be provided for Multivariate Analysis (MVA), Partial Least Squares (PLS), and Principle Component Analysis (PCA), and the output from the analysis/modeling applications can be provided to a SPC charting process for further manipulation and SPC rule evaluation.

Analysis and modeling applications can be used to view abnormalities and normal drifts that occur during wafer processing. When an abnormality or drift is discovered, steps can be taken to stop or adjust the process to bring it back within normal levels. Unlike in univariate monitoring, after a fault is detected, the engineer can take the current data to the model and have more guidance to bring the process back under control. Data collected using APC can be imported directly into third party modeling software programs to create models using the data. The models can be exported to the APC server for fault detection and parameter prediction.

Figure 12:
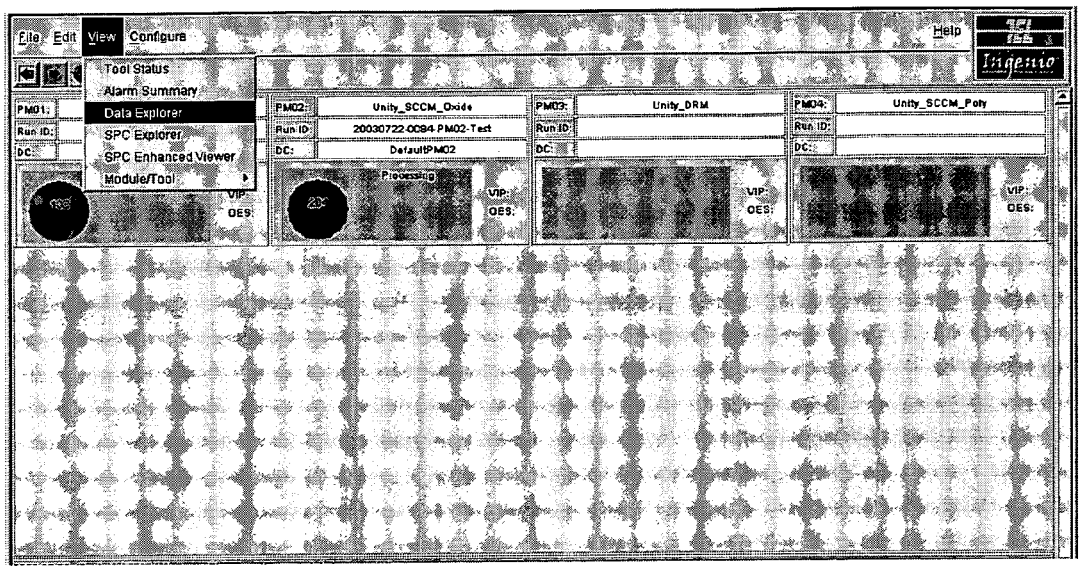
FIG. 12 shows an exemplary view of a Tool Status screen in accordance with one embodiment of the present invention.

In one aspect of the present invention, status data can be displayed using at least one GUI screen. For example, tool status data can be displayed using a GUI screen as shown in FIG. 12. Alternately, other status data can be displayed using other GUI screens. In one panel, current information can be displayed for each process chamber on this screen. Chamber information can comprise at least one process chamber name. Information about the wafer currently in the process chamber can be displayed in individual fields. Plan information can include the name of the data collection plan executed on the current wafer. Process chamber panels contain text and graphics to indicate the status of key elements of the chamber.

The software and associated GUI screens presented herein are also available in multiple languages. The GUI screen layouts have been designed to assist in global tool installations. Users in many countries will find the context-based data management software easy to use and understand. When a system is installed or the system configuration is changed, the software creates all required databases and files for the user. The context-based data management GUI screens provide a means of interaction between the system and various levels of end users.

The software sets up machine type and hardware configurations at installation and afterwards as configurations change. For example, user profiles can be created for language and user preferences for views providing features such as: Touch screen only, support for keyboard and mouse, multiple languages—Japanese, Taiwanese, Chinese, English, French, German, etc., user class-systems, class level, PE, EE, operator, color blind—gray scale/patterns or color, left to right, top to bottom workflow, icons, pictures, or words, static tabs and static tabs.

Numerous modifications and variations of the present invention are possible in light of the above teachings. It is therefore to be understood that, within the scope of the appended claims, the invention may be practiced otherwise than as specifically described herein.

What is claimed is:

1. An Advanced Process Control (APC) system for controlling a processing tool in a semiconductor processing environment, the APC system comprising:
    an APC server providing a plurality of APC related applications;
    an Interface Server (IS) coupled to the APC server;
    a database coupled to the IS and APC server; and
    a graphical user interface (GUD) component coupled to the APC server,
    wherein the IS comprises means for coupling to a plurality of process modules, means for coupling to a plurality of sensors, and means for coupling to the processing tool that comprises a tool agent in the processing tool and an agent client in the APC system, the agent client including an agent client communication class and a driver.

2. The APC system as claimed in claim 1, wherein the means for coupling to a plurality of sensors comprises means for coupling to an Optical Emissions Spectrum (OES) sensor.

3. The APC system as claimed in claim 2, wherein the means for coupling to the OES sensor comprises a TCP/IP connection.

4. The APC system as claimed in claim 1, wherein the means for coupling to a plurality of process modules comprises means for coupling to an Optical Data Profile (ODP) module.

5. The APC system as claimed in claim 4, wherein the means for coupling to an ODP module comprises means for coupling to an ODP library.

6. The APC system as claimed in claim 1, wherein the means for coupling to a plurality of sensors comprises means for coupling to a voltage/current (V/I) probe.

7. The APC system as claimed in claim 6, wherein the means for coupling to the V/I probe comprises a TCP/IP connection.

8. The APC system as claimed in claim 1, further comprising means for coupling to an E-diagnostics system.

9. The APC system as claimed in claim 1, further comprising means for coupling to a factory system.

10. The APC system as claimed in claim 1, wherein the APC system further comprises means for coupling to an analog probe.

11. The APC system as claimed in claim 10, wherein the means for coupling to the analog probe comprises a TCP/IP connection.

12. The APC system as claimed in claim 1, wherein the means for coupling to a plurality of process modules comprises means for coupling to an etching module.

13. The APC system as claimed in claim 11, wherein the means for coupling to a plurality of process modules comprises means for coupling to a deposition module.

14. The APC system as claimed in claim 1, wherein the means for coupling to a plurality of sensors comprises means for coupling to a sensor recorder base class that creates a Distributed Message Hub (DMH) client.

15. The APC system as claimed in claim 1, wherein the agent client communication class communicates with the tool agent via Berkeley sockets application programming interface (BSD sockets) and comprises at least one of a start agent method, an event receive thread, a get next message method, and a stop agent method.

16. The APC system as claimed in claim 1, wherein the APC server comprises a storage device having at least 3 GB of available disk space; a processor comprising at least two 600 MHz CPUs, and physical memory comprising at least 512 Mb of RAM.

17. The APC system as claimed in claim 1, wherein the APC server provides a plurality of applications, including at least one tool-related application, at least one module-related application, at least one sensor-related application, at least one IS-related application, at least one database-related application, and at least one GUI-related application.

18. The APC system as claimed in claim 1, wherein the APC server provides a plurality of applications, including at least one of a tool APC master application; a tool ARC alarm application; one or more sensor interface applications; an APC database management support application; an APC data collection support application; an APC event management support application; a probe interface application; an APC process chamber support application; an APC strategy selection application; a tool interface application; a wafer data application; and an APC Plan Executor (PE) application.

19. The APC system as claimed in claim 18, wherein the tool APC master application performs a plurality of functions, including at least one of a shut down all method, an initialization method, a logic manager boost method, a load configuration method, a load state method, a save configuration method, and an update GUI time method.

20. The APC system as claimed in claim 18, wherein the APC event management support application is configured to dispatch methods based on events.

21. The APC system as claimed in claim 18, wherein the APC event management support application performs a plurality of methods, including at least one of an active event method, a file ready method, an alarm method, a lot end method, a lot, start method, a recipe end method, a recipe start method, a (radio frequency) RF off method, a RF on method, a wafer in method, and a wafer out method.

22. The APC system as claimed in claim 18, wherein the APC data collection support application performs a number of methods, including at least one of a get lot data function, a get wafer data function, a setup sensors function, a start sensors function, a stop sensors function, and a load default plans function.

23. The APC system as claimed in claim 18, wherein the tool interface application is configured to manage a tool interface, file transfer, and status.

24. The APC system as claimed in claim 18, wherein the tool interface application performs a plurality of methods, including at least one of a change event method, a device failed method, a device recovery method, an active event method, a check active method, an event dispatcher method, an event receiver method, a get trace data method, a start agent method, and a stop agent method.

25. The APC system as claimed in claim 18, wherein the APC PE application is configured to determine which strategy to run, the strategy specifying a set of plans that is active at any given time.

26. The APC system as claimed in claim 18, wherein the APC PE application is configured to use context information to determine which strategy to run.

27. The APC system as claimed in claim 1, wherein the database comprises a plurality of tables, including at least one of a component table, an attribute table, a run attributes table, an associations table, a process run table, a device run table, a raw run data table, a model data table, a run summary table, and an alarm table, wherein the component table is used to configure components of the APC system and each component in the components table can have multiple associated records in the attribute table.

28. The APC system as claimed in claim 27, wherein the process run table comprises context items, including start time, wafer, and material type.

29. The APC system as claimed in claim 27, wherein the device run table comprises setup and operating parameters for a sensor.

30. The APC system as claimed in claim 27, wherein the raw run data table comprises raw observation data.

31. The APC system as claimed in claim 27, wherein the model data table can be a dynamically created table to hold in put and output data for model analysis.

32. The APC system as claimed in claim 27, wherein the run summary table comprises run summary information, including a run ID, a run type, a value name, a start step, and end step, a value minimum, and a value maximum.

33. A method for using an Advanced Process Control (APC) system for controlling a processing tool in a semiconductor processing environment, the method comprising:
providing an APC server providing a plurality of APC related applications;
providing an Interface Server (IS) coupled to the APC server;
providing a database coupled to the IS and APC server; and
providing a graphical user interface (GUI) component coupled to the APC server,
wherein the IS comprises means for coupling to plurality of process modules, means for coupling to a plurality of sensors, and means for coupling to the processing tool that comprises a tool agent in the processing tool and an agent client in the APC system, the agent client including an agent client communication class and a driver.

* * * * *